US012648463B2

(12) United States Patent
Hammann et al.

(10) Patent No.: US 12,648,463 B2
(45) Date of Patent: Jun. 2, 2026

(54) FILLING MATERIALS AND METHODS OF FILLING VIAS

(71) Applicant: SAMTEC, INC., New Albany, IN (US)

(72) Inventors: Thomas Jacob Hammann, Arvada, CO (US); Adam Owens, New Albany, IN (US); Christopher Bohn, New Albany, IN (US); Nathan Hagan, New Albany, IN (US); Nathan Robertson, New Albany, IN (US); Peter Wrschka, New Albany, IN (US)

(73) Assignee: SAMTEC, INC., New Albany, IN (US)

( * ) Notice: Subject to any disclaimer, the term of this patent is extended or adjusted under 35 U.S.C. 154(b) by 287 days.

(21) Appl. No.: 18/549,742

(22) PCT Filed: Mar. 10, 2022

(86) PCT No.: PCT/US2022/019670
§ 371 (c)(1),
(2) Date: Sep. 8, 2023

(87) PCT Pub. No.: WO2022/192485
PCT Pub. Date: Sep. 15, 2022

(65) Prior Publication Data
US 2025/0087569 A1      Mar. 13, 2025

Related U.S. Application Data

(60) Provisional application No. 63/288,990, filed on Dec. 13, 2021, provisional application No. 63/257,322, filed on Oct. 19, 2021, provisional application No. 63/159,178, filed on Mar. 10, 2021.

(51) Int. Cl.
*H01L 23/498* (2006.01)

(52) U.S. Cl.
CPC .............................. *H01L 23/49827* (2013.01)

(58) Field of Classification Search
CPC .................................................... H05K 3/0094
See application file for complete search history.

(56) References Cited

U.S. PATENT DOCUMENTS

| | | | |
|---|---|---|---|
| 6,765,779 | B2 | 7/2004 | Stevenson et al. |
| 8,653,384 | B2 | 2/2014 | Tang et al. |
| 11,171,094 | B2 | 11/2021 | Mazumder et al. |
| 12,100,647 | B2 | 9/2024 | Nolet et al. |
| 2002/0139556 | A1 | 10/2002 | Ok et al. |
| 2003/0060000 | A1 | 3/2003 | Umetsu et al. |
| 2003/0213605 | A1 | 11/2003 | Brendel et al. |
| 2005/0064707 | A1 | 3/2005 | Sinha |
| 2006/0069171 | A1 | 3/2006 | Prokopowicz et al. |
| 2008/0060840 | A1 | 3/2008 | Wu |
| 2009/0243756 | A1 | 10/2009 | Stevenson et al. |

(Continued)

FOREIGN PATENT DOCUMENTS

| | | |
|---|---|---|
| TW | 201225223 A | 6/2012 |
| WO | 2007/089206 A1 | 8/2007 |
| WO | 2019/191621 A1 | 10/2019 |

*Primary Examiner* — Timothy J Thompson
*Assistant Examiner* — John B Freal
(74) *Attorney, Agent, or Firm* — Gray Ice Higdon

(57) ABSTRACT

Electrically conductive pastes are disclosed that are configured to fill a hole in a substrate. The paste can be cured in the hole so as to define an electrically conductive metallized via. Fills that perform at high temperatures are also disclosed.

13 Claims, 14 Drawing Sheets

(56)     References Cited

U.S. PATENT DOCUMENTS

| 2011/0248184 | A1 | 10/2011 | Shah |
| 2012/0067611 | A1 | 3/2012 | Kohda |
| 2014/0008815 | A1 | 1/2014 | Park et al. |
| 2016/0316563 | A1* | 10/2016 | Sidhu ................... H05K 3/0094 |
| 2017/0084766 | A1 | 3/2017 | Yang et al. |
| 2017/0250141 | A1 | 8/2017 | Imayoshi |
| 2019/0098743 | A1 | 3/2019 | Molla et al. |
| 2019/0287853 | A1 | 9/2019 | Maekawa et al. |
| 2019/0313524 | A1 | 10/2019 | Huang et al. |
| 2020/0203266 | A1 | 6/2020 | Iwai et al. |
| 2023/0284380 | A1* | 9/2023 | Otomi .................. H05K 3/0094 |
| | | | 174/253 |

* cited by examiner

FILLING MATERIALS AND METHODS OF FILLING VIAS

CROSS-REFERENCE TO RELATED APPLICATIONS

This application is the National Stage Application of International Patent Application No. PCT/US2022/019670, filed Mar. 10, 2022, which claims priority to U.S. Patent Application Ser. No. 63/159,178 filed Mar. 10, 2021, U.S. Patent Application Ser. No. 63/257,322 filed Oct. 19, 2021, and U.S. Patent Application Ser. No. 63/288,990 filed Dec. 13, 2021, the disclosure of each of which is hereby incorporated by reference as if set forth in its entirety herein.

TECHNICAL FIELD

The present disclosure relates to filling passages with metallized materials to establish electrically conductive paths for use in electronic applications.

BACKGROUND

Semiconductor devices are constantly responding to the market demand for faster, smaller, higher data and less expensive devices. Devices are expected to deliver more functionality at greater speeds in smaller dimensions and with capabilities of electrical and optical signals. This requires a new packaging scheme that can integrate heterogeneous devices such as logic, memory, power, graphics, sensors and other integrated circuits and components in a single package where improved electrical performance is also achieved by having these devices in close proximity.

Microscopic through-holes in a glass substrate are filled with materials that are usually metallized, and can act as electrical connectors between the top and bottom surface of the glass substrate to transfer electronic signals and currents to semiconductor or other devices. Glass and glassy substrates include borosilicate, quartz, sapphire, and other substrates with, toughness, pressure sensitivity, thermal expansion, dielectric properties and transparency designed for specific applications.

SUMMARY

In accordance with one example, an electrically conductive component can include a substrate that defines an external first surface and an external second surface opposite the first surface, and at least one electrically conductive via that extends from the first surface toward the second surface. The electrically conductive via includes an electrically conductive fill. The electrically conductive fill can include a cured carrier, and a plurality of electrically conductive particles disposed in the cured carrier.

BRIEF DESCRIPTION OF THE DRAWINGS

Any feature or combination of features described herein are included within the scope of the present disclosure provided that the features included in any such combination are not mutually inconsistent as will be apparent from the context, this specification, and the knowledge of one of ordinary skill in the art. Additional advantages and aspects of the present disclosure are apparent in the following detailed description and claims, and the following drawings in which:

DETAILED DESCRIPTION

Figure 1A:
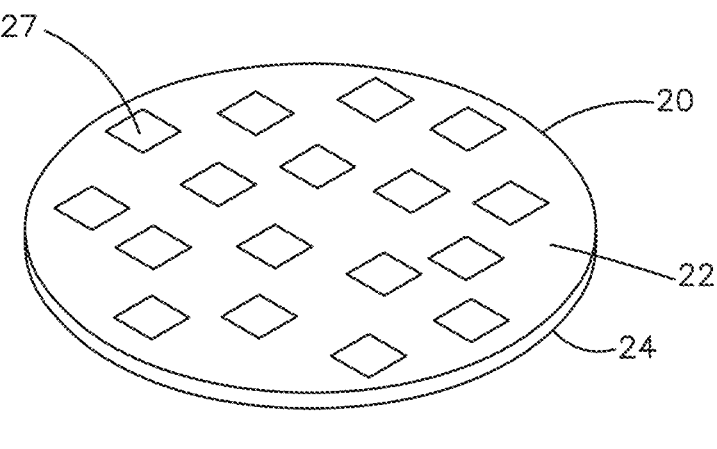
FIG. 1A is a perspective view of a substrate having a plurality of hole arrays that each define a respective plurality of holes.

The present disclosure recognizes that certain applications for metallized substrates can benefit when the metallized substrates are biocompatible. Accordingly, the metallized substrates constructed in accordance with certain examples of the disclosure set forth below can be lead-free. The present inventors have discovered that, in conventional via-filling techniques, lead interacts with metallic particles, such as copper, to produce a sufficiently electrically conductive paste that can be sintered at sufficiently low temperatures to avoid compromising the integrity of the substrate. The present disclosure provides a lead-free electrically conductive fill material that can avoid the need to sinter the electrical particles.

One or more different disclosures may be described in the present application. Further, for one or more of the disclosures described herein, numerous alternative embodiments may be described: it should be appreciated that these are presented for illustrative purposes only and are not limiting of the disclosures contained herein or the claims presented herein in any way. One or more of the disclosures may be widely applicable to numerous embodiments, as may be readily apparent from the disclosure. In general, embodiments are described in sufficient detail to enable those skilled in the art to practice one or more of the disclosures, and it should be appreciated that other embodiments may be utilized and that structural, logical, software, electrical and other changes may be made without departing from the scope of the particular disclosures. Accordingly, one skilled in the art will recognize that one or more of the disclosures may be practiced with various modifications and alterations. Particular features of one or more of the disclosures described herein may be described with reference to one or more particular embodiments or figures that form a part of the present disclosure, and in which are shown, by way of illustration, specific embodiments of one or more of the disclosures. It should be appreciated, however, that such features are not limited to usage in the one or more particular embodiments or figures with reference to which they are described. The present disclosure is neither a literal description of all embodiments of one or more of the disclosures nor a listing of features of one or more of the disclosures that must be present in all embodiments.

A description of an embodiment with several components in communication with each other does not imply that all such components are required. To the contrary, a variety of optional components may be described to illustrate a wide variety of possible embodiments and in order to more fully illustrate one or more aspects of the embodiments. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Further still, some steps illustrated in a method can be omitted. Moreover, the illustration of a process by its depiction in a drawing does not imply that the illustrated process is exclusive of other variations and modifications thereto, does not imply that the illustrated process or any of its steps are necessary to one or more of the disclosure(s), and does not imply that the illustrated process is preferred. Also, steps are generally described once per embodiment, but this does not mean they must occur once, or that they may only occur once each time a process, method, or algorithm is carried out or executed. Some steps may be omitted in some embodiments or some occurrences, or some steps may be executed more than once in a given embodiment or occurrence. Further, some of the steps can be eliminated in some embodiments. Further still, other steps can be added as desired.

Techniques and mechanisms described or referenced herein will sometimes be described in singular form for clarity. However, it should be appreciated that particular embodiments may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternative implementations are included within the scope of embodiments of the present disclosure in which, for example, functions may be executed out of order from that shown or discussed, including substantially concurrently or in reverse order, depending on the functionality involved, as would be understood by those having ordinary skill in the art.

Figure 1B:
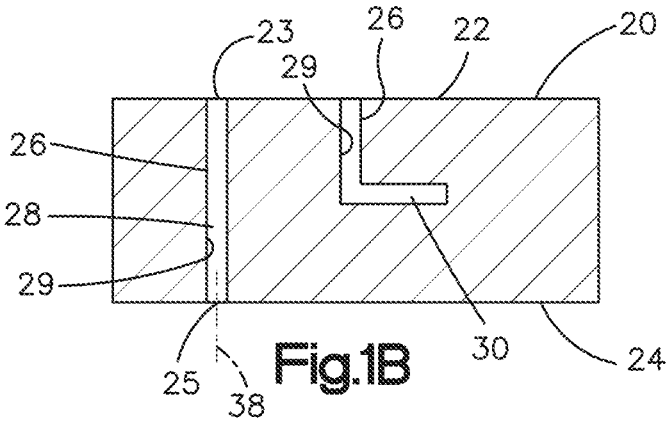
FIG. 1B is a schematic sectional side elevation view of a portion of the substrate illustrated in FIG. 1A, showing a through hole and a blind hole.

With initial reference to FIGS. 1A-1B, a substrate 20 defines opposed external surfaces including an external first surface 22 and an external second surface 24 opposite the first surface along a direction D. The substrate 20 further includes a plurality of internal surfaces 29 that define a respective plurality of holes 26 open to at least one of or both of the first and second surface 22 and 24. The substrate 20 can be cut into wafers of 150 mm, 200 mm, or 300 mm in diameter, but it is recognized that the substrate 20 can define any suitable diameter or other maximum dimension as desired. Thus, the term "diameter" can be used interchangeably with the term "maximum cross-sectional dimension" to denote that the structure of reference need not be circular unless otherwise indicated.

In one example, the substrate can be a glass substrate. The glass substrate can be made from borosilicate. In another example, the glass substrate can be made of quartz. Alternatively still, the glass substrate can be made from one or more up to all of borosilicate, aluminosilicate, and quartz including single-crystal quartz, and synthetic quartz. The glass substrate can alternatively be made of any suitable alternative glass substrate materials or combinations thereof. Alternatively still, the substrate can be made of sapphire, silica, zinc oxide, zirconium oxide, including yttria-stabilized zirconium oxide, ceramic, or combinations thereof. In certain examples, the glass substrate can be lead-free, meaning that the glass substrate can be free of lead including lead oxides, lead alloys, lead compounds, and all lead constituents. In one example, the substrate can have a coefficient of thermal expansion from about 0.05 ppm per degree centigrade to about 15 ppm per degree centigrade.

The term "lead-free." "free of lead." and derivatives thereof can mean that means that the quantity of lead is in accordance with the Restriction of Hazardous Substances Directive (RoHS) specifications. In one example, the term "lead-free," "free of lead," and derivatives thereof can mean that means that the quantity of lead is less than. 1% by weight. Alternatively or additionally, the term "lead-free." "free of lead," and derivatives thereof can mean that means that the quantity of lead is less than 0.1% by volume. In another example, the term "lead-free." "free of lead." and derivatives thereof can mean that the quantity of lead is less than 100 parts per million (ppm). In still other examples, the term "lead-free." "free of lead." and derivatives thereof can mean entirely devoid of lead.

The holes 26 can have any suitable diameter as desired. For instance, the holes 26 can have a diameter or other cross-sectional dimension that is in a range from approximately 10 µm to approximately 25 µm. The holes 26 can have a depth along their respective central axes within a range from approximately 100 µm to approximately 500 µm. The diameter requirements have no upper limit. The aspect ratio between hole diameter and hole depth are unlimited for this process. Additionally, a plurality of different hole diameters may be placed in the same substrate. The holes 26 can be conical in shape, cylindrical in shape, hourglass shaped, or can define any suitable shape along their length. The holes 26 can be arranged in one or more hole arrays 27 as desired. Thus, the substrate 20 can define one or more arrays 27 spaced with each other at any suitable distance suitable for cutting the glass and separating the arrays 27 into discrete components of the substrate 20. While glass substrates can have particular applicability to certain end-use applications, it should be appreciated that substrate 20 can be a glass substrate, a silicon substrate, a ceramic substrate, a sapphire substrate, or any organic substrate or any other substrate of any suitable alternative material as desired. When the substrate 20 is a glass substrate, the glass can be substantially lead-free, including lead-free, in one example. In other examples, the glass can include lead.

At least one or more of the holes 26 can be configured as a through hole 28 that extends through the substrate 20 from the first surface 22 to the second surface 24 along a respective central axis 38. Thus, the through hole 28 defines a first opening 23 at the first surface 22, and a second opening 25 at the second surface 24. The through hole 28 defines a first end at the first opening 23, and a second end at the second opening 25. Thus, both the first and second ends of the through holes 28 are open to the outer perimeter of the substrate 20. The through hole 28 can be straight and linear from the first opening 23 to the second opening 25. Thus, the central axis 38 can extend in a direction that separates the first surface 22 from the second surface 24. The central axis 38 can be straight and linear from the first surface 22 to the second surface 24. Alternatively, one or more portions of the through hole 28 can be angled, bent, or define any suitable alternative non-straight shape. Thus, at least one or more portions of the central axis 38 can be angled, bent, or define any suitable alternative non-straight shape between the first surface 22 and the second surface 24. As used herein, the word "hole" and "through-hole" are used interchangeably. As used herein, the term "partially" is defined as being to some extent, but not wholly, that which is specified. As used herein, the term "completely" is defined as being wholly or entirely that which is specified.

Further, as used herein, the singular term "a" or "the" with respect to an apparatus or method step can include the plural apparatus or method steps. Conversely, the plural term as used herein with respect to an apparatus or method step can include the singular "a" or "the." Thus, it should be appreciated that the use herein of the singular term "a" or "the" and the use herein of the plural term can equally apply to "at least one" unless otherwise indicated.

Alternatively or additionally, at least one or more of the holes 26 can be configured as a blind hole 30 that can extend along a respective central axis from one of the first and second surfaces 22 and 24 toward the other one of the first and second surfaces 22 and 24, but terminates without extending to the other of the first and second surfaces and 22 and 24. Thus, the blind hole 30 has a first end that is open to one of the first and second surfaces 22 and 24 of the substrate 20 in the manner described above with respect to the through hole 28. The blind hole 30 has a second end opposite the first end along the central axis. The second end is closed internally in the substrate 20 at a location between the first surface 22 and the second surface 24. Otherwise stated, the first end of the blind hole 30 extends to one of the first and second openings 23 and 25 at the first and second surfaces 22 and 24, respectively, and the second terminal end of the blind hole 30 terminates at a location between the first and second surfaces 22 and 24. It is recognized, however, that the second terminal end of the blind hole 30 can terminate at another hole 26, and thus can be in fluid communication with both the first and second openings 23 and 25. Further, as described above with respect to the through hole 28, the blind hole 30 can be linear, or can have one or more segments that are angled or bent with respect to the direction that separates the first and second surfaces 22 and 24, or otherwise non-straight. In some examples, the substrate 20 can include a sacrificial hole that extends from the blind hole 30 to an external surface of the substrate 20. For instance, when the blind hole 30 is open to the first surface 22 of the substrate 20, the sacrificial hole can extend from the closed end of the blind hole 30 to the second surface 24.

Figure 2A:
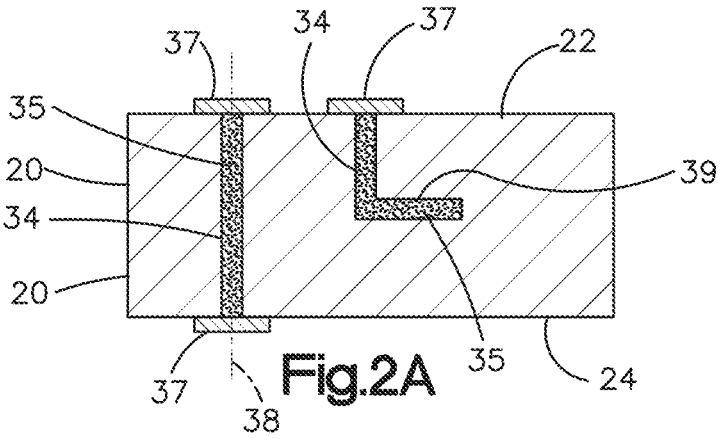
FIG. 2A is a schematic sectional side elevation view similar to FIG. 1, but showing the holes including an electrically conductive fill so as to define electrically conductive vias, and electrically conductive redistribution layers over the vias.
Figures 2B, 3A, 3B, 3C, 3D:
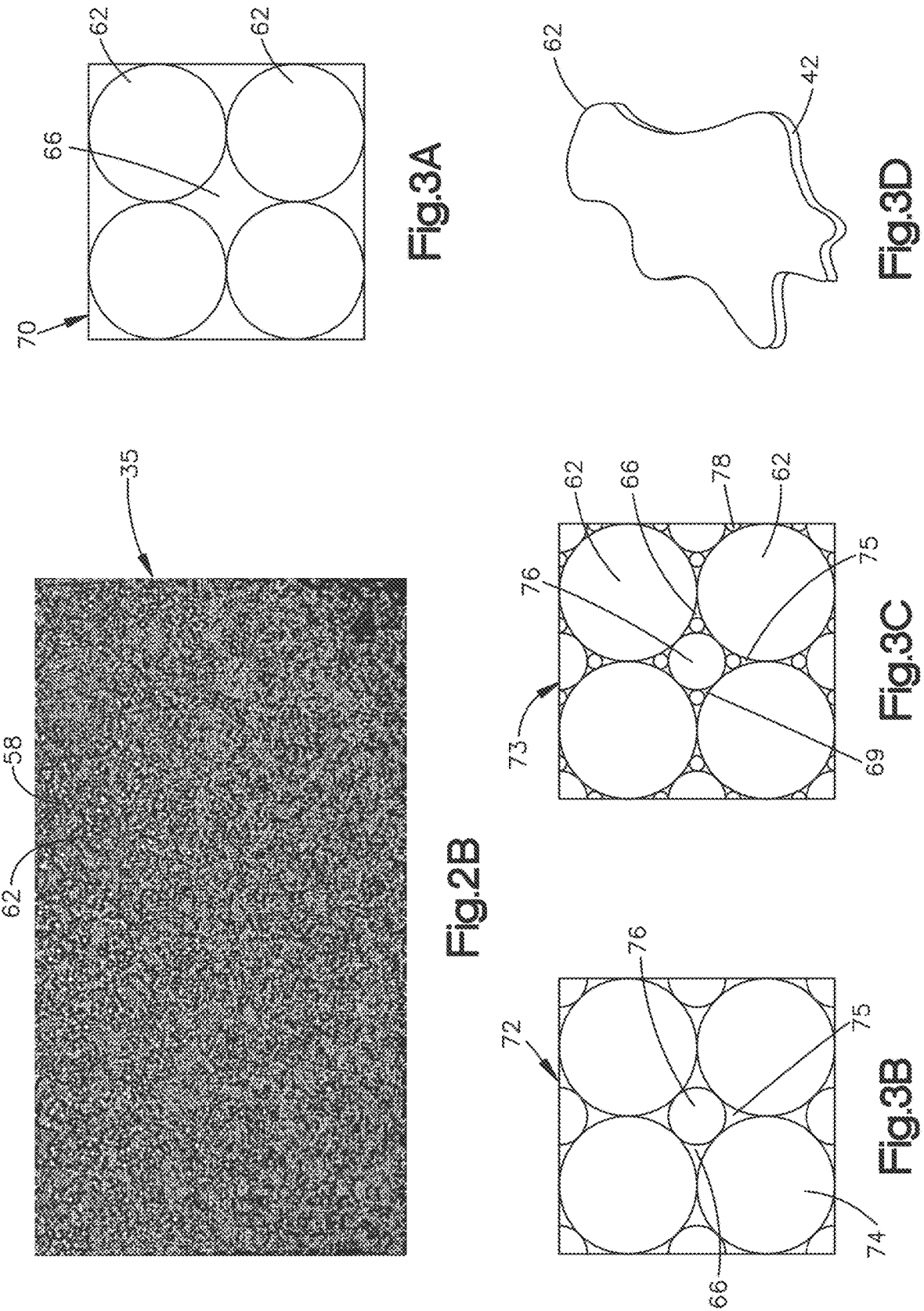
FIG. 2B is a SEM micrograph of a portion of one of the vias illustrated in FIG. 2A.
FIG. 3A is a schematic view the particles of a paste that is configured to produce the electrically conductive fill illustrated in FIG. 2B, shown including a monomodal particle distribution.
FIG. 3B is a schematic sectional view of the particles of the suspension illustrated in FIG. 3A, shown defining a bimodal distribution.
FIG. 3C is a schematic sectional view of the particles of the suspension illustrated in FIGS. 3A-3B, shown including a trimodal distribution.
FIG. 3D is a perspective view of a flake 42 that can be included in the particles illustrated in FIGS. 3A-3C.

Referring now to FIGS. 2A-2B, in accordance with one example, one or more up to all of the holes 26 can contain an electrically conductive fill 35 so as to define an electrically conductive via 34. Thus, the central axis of the hole 26 defines the central axis of the corresponding via 34. The through hole 28 that contains the electrically conductive fill 35 can be said to define a through via 36. The blind hole 30 that contains the electrically conductive fill 35 can be said to define a blind via 39. Thus, the term "via" and derivatives thereof as used herein can refer to one or both of the through via 36 and the blind via 39. The hole arrays 27 including the electrically conductive fill illustrated in FIGS. 2A-2B can thus define via arrays. In this regard, it will be appreciated that the substrate 20 having electrically conductive vias 34 can be referred to as an electrical component or electrically conductive component. As will be appreciated from the description below, the electrically conductive vias 34 can be suitable for conducting both direct current (DC) and radiofrequency (RF) current.

The electrically conductive via 34 defines first and second ends that are defined by the first and second ends of the corresponding hole 26. In examples whereby the electrically conductive fill 35 occupies a substantial entirety of the hole 26 and terminates at the first and second ends of the corresponding hole 26, the first and second ends of the resulting electrically conductive via 34 can be defined by respective first and second ends of the electrically conductive fill 35.

The electrically conductive via 34 thus defines an electrical path from the first end of the electrically conductive via 34 to the second end of the electrically conductive via 34. The electrical path can extend along a direction substantially parallel to the central axis of the electrically conductive via 34. In some examples, the electrically conductive fill 35 extends continuously from the first end of the hole 26 to the second end. Thus, the electrically conductive via 34 defines an electrical path from the first end of the via to the second end of the via, the electrical path being defined only by the electrically conductive fill 35. In other examples, the electrically conductive fill 35 can be spaced from either or both of the first and second ends of the hole 26, and one or more electrical conductors can extend from the electrically conductive fill to the either or both of the first and second ends of the hole 26. Thus, in this example, the via 34 defines an electrical path from the first end of the via to the second end of the via, the electrical path being defined by the electrically conductive fill and the one or more electrical conductors.

With continuing reference to FIG. 2A, the substrate 20 can include at least one or more electrically conductive redistribution layers 37. The redistribution layers can be applied to one or both of the first surface 22 and the second surface 24. The redistribution layers 37 extend over at least one of the electrically conductive vias 34, and are thus in electrical communication with the electrically conductive fill 35. In one example, the substrate 20 can be configured as an electrical interposer configured to make electrical connections at each of the first surface 22 and the second surface 24 at electrical contacts that are in electrical communication with each other through the electrically conductive via 34.

Paste Material

Referring now to FIGS. 2B-4, the electrically conductive fill 35 can be defined by an electrically conductive paste 40 that is introduced into the hole 26 so as to create the electrically conductive via 34. As will be described in more detail below, the electrically conductive paste 40 can be introduced into the hole 26 and subsequently cured so as to define the electrically conductive fill 35. In one example, the electrically conductive paste 40 can include a viscous carrier 58, and a plurality of particles 62 of electrically conductive material supported by or otherwise disposed in the viscous carrier 58. For instance, the particles 62 can be suspended in the viscous carrier 58. The carrier 58 can be a resin. The resin can be a thermally curable resin, and can thus transform from a viscous state to a hardened state.

In some examples, the carrier 58 can be a dielectric carrier. The electrically conductive particles can be present in sufficient quantity so that the paste 40 is electrically conductive prior to curing the paste 40. In other examples, the paste can be electrically nonconductive prior to curing the paste 40, but electrically conductive after curing. In one example, the carrier 58 can be an epoxy dielectric carrier. The carrier can be thermally curable. One example of such an epoxy is Duralco 4460 commercially available from Cotronics Corp. having a principle place of business in Brooklyn, NY Another example is Duralco 4701 commercially available from Cotronics Corp. It is recognized that any suitable epoxy can be used. The epoxy can have any suitable curing temperature as desired. In one example, the curing temperature of the epoxy is approximately 125 degrees Celsius in air at atmospheric pressure. In other examples, the carrier 58 can be a polyimide dielectric carrier. It should be appreciated, of course, that the carrier 58 can be any suitable material that can be blended in a liquid state with electrically conductive particles prior to curing to a solid rigid state. For instance, in other examples, the carrier 58 can be a sodium silicate, also known as water glass. For instance, the carrier 58 can be acquired under the tradename MB600 commercially available from Masterbond, Inc having a principal place of business in Hackensck, NJ. The carrier 58 can be cured thermally or under ultraviolet light. For instance, in some examples the resin can be cured upon exposure to ultraviolet light. In still other examples, the carrier 58 can be an electrically conductive carrier.

In one example, the electrically conductive material can be metallic. For instance, the electrically conductive material can be gold and/or one or more alloys thereof and/or one or more oxides thereof. Alternatively or additionally, the electrically conductive material can be platinum and/or one or more alloys thereof and/or one or more oxides thereof. Alternatively still, the electrically conductive material can include 1) gold and/or one or more alloys thereof and/or one or more oxides thereof, and 2) platinum and/or one or more alloys thereof and one/or one or more oxides thereof. In one example, the electrically conductive material can include only 1) gold and/or one or more alloys thereof and/or one or more oxides thereof, and/or 2) platinum and/or one or more alloys thereof and/or one or more oxides thereof. Thus, the electrically conductive material can consist essentially of or consist of 1) gold and/or one or more alloys thereof and/or one or more oxides thereof, and/or 2) platinum and/or one or more alloys thereof and/or one or more oxides thereof.

Accordingly, the particles 62 can be either or both of 1) gold and/or one or more alloys thereof and/or one or more oxides thereof and 2) platinum and/or one or more alloys thereof and/or one or more oxides thereof. Alternatively still, the electrically conductive material can include 1) gold and/or one or more alloys thereof and/or one or more oxides thereof, and 2) platinum and/or one or more alloys thereof and one/or one or more oxides thereof. In one example, the electrically conductive particles 62 can include only 1) particles of gold and/or one or more alloys thereof and/or one or more oxides thereof, and/or 2) particles of platinum and/or one or more alloys thereof and/or one or more oxides thereof. Thus, the electrically conductive particles can consist essentially of or consist of 1) particles of gold and/or one or more alloys thereof and/or one or more oxides thereof, and/or 2) particles of platinum and/or one or more alloys thereof and/or one or more oxides thereof.

In other examples, the electrically conductive material, and thus the particles 62, can include copper, silver, aluminum, nickel, tungsten, molybdenum, silicon, aluminum, zinc, barium, boron, bismuth, titanium, metal compounds, or any suitable alternative metal and/or alloys thereof or other combinations thereof. Thus, in certain examples, the electrically conductive vias 34 can be referred to as metallized vias 34. Similarly, the substrate 20 can be referred to as a metallized substrate. It should be appreciated that the at least one electrically conductive material can be any material suitable for metallizing the substrate in the at least one passage, unless otherwise indicated.

It should therefore be appreciated that both the electrically conductive material and the carrier 58 can be lead-free. In some examples the paste 40, and the resulting electrically conductive fill 35 can include only the electrically conductive material and the carrier 58. Therefore, the paste 40 can be lead-free. The term "lead free" can mean free of lead including lead oxides, lead alloys, lead compounds, and all lead constituents. Thus, the paste 40 is usable in applications where biocompatibility is desired. In some examples the paste 40, and thus the electrically conductive fill 35, can include only the electrically conductive material and the carrier 58. It has been found that the carrier 58 can provide adhesion to the internal surface 29 of the substrate 20 (see FIG. 1B), and the particles 62 of the electrically conductive material in the carrier 58 in sufficient quantity can render the paste 40) electrically conductive. Thus, the paste 40, and the resulting electrically conductive material 35, can be fritless or devoid of glass frit. In these examples, it can be said that the paste 40), and thus the electrically conducive fill 35 and the metalized via 34 consists the electrically conductive material or particles 62 and the carrier 58. In certain specific examples, it is envisioned that the paste 40 can be fritless. For instance, when the electrically conductive material 35 of the paste 40 is platinum and/or at least one alloy of platinum and/or at least one oxide of platinum, the paste 40 can be fritless. Further, when the electrically conductive material 35 of the paste 40 is gold and/or at least one alloy of gold and/or at least one oxide of gold, the paste 40 can be fritless. It is envisioned that the paste 40 can be fritless when the electrically conductive material 35 comprises any one or more of the other electrically conductive materials described herein. Of course, the paste 40 can also include a glass frit if desired.

In some examples, the particles 62 can occupy from approximately 10% up to approximately 90% of the volume of the paste 40, and thus of the resulting electrically conductive fill 35 and via 34. The remaining volume can be occupied by the carrier 58. For instance, the particles 62 can occupy between approximately 50% to approximately 85% of the volume of the paste 40, and the remaining approximately 15% to approximately 50% of the volume of the paste can be occupied by the carrier 58. It has been found that less viscous carriers can allow for higher percentages of particles 62 by volume. The paste can have a viscosity from about 30 Pascal Seconds (PA·S) to about 400 PA·S. The paste can have a dynamic viscosity that is in a range from approximately 1 centipoise (cP) to approximately 40,000 cP. For instance, the range can be from approximately 1.5 cP to approximately 1,000 cP. In one example, the range can be from approximately 30 cP to approximately 300 cP. In another example, the range can be from approximately 1.8 cP to approximately 15 cP. For instance, the range can be from approximately 1.9 cP to approximately 5 cP. It is recognized that low viscosity pastes allow for large quantities of electrically conductive material to be included in the paste 40 while preventing the paste 40 from reaching a thickness level that prevents its ability to be filled into the one or more holes of the substrate.

Other examples recognize that the cost of the electrically conductive material can be reduced by correspondingly reducing the quantity of particles 62 so long as the resulting electrically conductive fill 35 remains adequately electrically conductive. Accordingly, some of the electrically conductive particles of the paste 40 can be replaced with electrically nonconductive particles such as glass in the paste 40. It is appreciated in some examples that the electrically nonconductive particles do not contribute to the electrical conductivity of the paste 40 and resulting electrically conductive fill 35, and do not contribute to the adhesion of the paste 40 and resulting electrically conductive fill

35 to the substrate 20. Accordingly, it can be said in such examples that the paste 40, and resulting electrically conductive fill 35, consists essentially of the particles 62 and the carrier 58. In some examples, the paste 40, and resulting electrically conductive fill 35, consists of the particles 62 and the carrier 58.

In still other examples, the paste 40 can include a glass frit if desired, to increase the adhesion of the paste 40 to the internal surface 29 of the substrate 20. The glass frit can include one or more of the following materials and/or one or more alloys thereof and/or one or more oxides thereof: Ag, Al, B, Bi, Ce, Cu, Co, F, Zn, Zr, Si, Ba, Ru, Sn, Mg, Te, Ti, V, Na, K, Li, Ca, and P. Thus, the glass frit can be lead-free. Accordingly, when the paste 40 and resulting electrically conductive fill 35 include the glass frit, the paste 40 and resulting electrically conductive fill can be lead free. In some embodiments, the glass frit composition can be about 1% to about 20% of the metallized paste and comprises a mixture of glass frits by volume.

Referring now to FIG. 3A, in some embodiments, the metallic electrically conductive particles 62 can define any suitable particle size as measured at a maximum cross-sectional dimension of the particles 62. In some embodiments, the particles can be substantially spherically shaped, such that the maximum cross-sectional dimension defines a diameter of the particles. In other example, some or all of the particles can be irregularly shaped. In some embodiments, a combination of powders with different particle sizes and shapes can be mixed for through hole filling applications.

The particles 62 can define a powder having a D50 particle size (fifty percentile particle size distribution of the particles 62) that is in a range from approximately 0.01 to approximately 24 microns for D50. For instance, the D50 particle size can be in a range from approximately 0.2 microns up to approximately 10 microns. For instance, the D50 particle size can be approximately 1 micron. It should also be appreciated that individual particles 62 of the powder can have the particle sizes described above. Unless otherwise indicated, the terms "approximately" and "substantially" and derivatives thereof as used herein with respect to dimensions, values, shapes, directions, and other parameters can include the stated dimensions, values, shapes, directions, and other parameters and up to plus or minus 10% of the stated dimensions, values, shapes, directions, and other parameters, such as up to plus or minus 9% of the stated dimensions, values, shapes, directions, and other parameters, such as up to plus or minus 8% of the stated dimensions, values, shapes, directions, and other parameters, such as up to plus or minus 7% of the stated dimensions, values, shapes, directions, and other parameters, such as up to plus or minus 6% of the stated dimensions, values, shapes, directions, and other parameters, such as up to plus or minus 5% of the stated dimensions, values, shapes, directions, and other parameters, such as up to plus or minus 4% of the stated dimensions, values, shapes, directions, and other parameters, such as up to plus or minus 3% of the stated dimensions, values, shapes, directions, and other parameters, such as up to plus or minus 2% of the stated dimensions, values, shapes, directions, and other parameters, such as up to plus or minus 1% of the stated dimensions, values, shapes, directions, and other parameters.

Referring to FIG. 3A, the particles 62 can define a monomodal distribution 70. Without intending to be limiting unless otherwise indicated herein, in the monomodal distribution 70, the particles 62 can be within a range of plus or minus 100% of the average particle size. For instance, the range can be of plus or minus 50% of the average particle size of the monomodal distribution.

In one example, without being limiting unless otherwise indicated in the claims, the particles can define a monomodal distribution 70, having an average particle size in a range from approximately 1 micron to approximately 10 microns, such as approximately 1.2 microns. For instance, the average particle size of the particles 62 can be in a range from approximately 1 micron to approximately 6 microns, such as approximately 1.4 microns. In one example, the average size of the particles 62 can be range from approximately 2 microns to approximately 4 microns. In another example, the average size of the particles 62 can be in a range from approximately 2.5 microns to approximately 3.5 microns. The particles 62 of the monomodal distribution can define interstices 66. It is recognized that the carrier 58 can be disposed in the interstices 66. For instance, the carrier 58 can fill the interstices 66. Alternatively, the particles 62 can define a multimodal distribution, in which additional metallic particles are disposed in the interstices 66.

For instance, referring now to FIG. 3B, the particles 62 can define a bimodal distribution 72. The bimodal distribution of the particles 62 can have a fill density of the electrically conductive particles in the via 34 that is greater than the fill density of the monomodal distribution. The fill density can be defined as the density of the particles in the via 34. Thus, it is envisioned that in some examples the vias 34 produced from a bimodal distribution can have a greater electrical conductivity than the vias 34 produced from a monomodal distribution.

The particles 62 can include a plurality of first bimodal particles 74 and a plurality of second bimodal particles 76. The first bimodal particles 74 can have a first bimodal average particle size as described above with respect to the particles 62 of the monomodal distribution. The second bimodal particles 76 can have a second bimodal average particle size that is less than the first bimodal average particle size of the first bimodal particles 74. Accordingly, the second bimodal particles 76 can fit in, and be disposed in, respective interstices 66 defined by the first bimodal particles 74. In one example, the second bimodal particles 76 can have a second average particle size of the bimodal particles 76 can is in a range from approximately 0.3 micron to approximately 1 micron. For instance, the second average particle size can be approximately 0.6 micron.

In some examples, it can be desirable to maximize the size of the second bimodal particles 76 so that they fit in respective ones of the interstices 66 without expanding the interstices 66. It is appreciated, however, that the second bimodal particles 76 can expand the interstices 66 while increasing the density of the first particles with respect to the monomodal distribution. Regardless, the first and second bimodal particles 74 and 76 can be said to combine so as to define second bimodal interstices 75 that are smaller than the interstices 66 that can be referred to as first bimodal interstices. Further, the second bimodal interstices 75 can be disposed inside the first bimodal interstices 66.

While not being limiting unless otherwise indicated, the first bimodal particle size and the second bimodal average particle size can define a ratio within a range from approximately 4:1 to approximately 10:1. For instance, the ratio can be approximately 7:1. In other examples, the ratio can range from approximately 1.5:1 to approximately 12:1. For instance, the ratio can range from approximately 1.5:1 to approximately 3.5:1. It is envisioned that the size of the interstices 66 that contain the bimodal particles 74 remains sufficiently large such that the bimodal interstices 66 combine to define a liquid flow path to evacuate the liquid medium 64 from the holes 26 of the substrate 20, while sufficiently small such that the resulting via 34 contains a suitable volume of the electrically conductive material of the particles so as to define a reliable electrical path. It should be appreciated that the second particles 62*b* of the second suspension 60*b* can also define the bimodal distribution if desired. In particular, one or both of the first and second particles 62*a* and 62*b* can include the bimodal distribution. The second bimodal particles 76 can included in a quantity within a range from approximately five percent by volume of the hole to approximately 20 percent by volume of the hole. For instance, the quantity can be approximately ten percent by volume of the hole. It is understood that including the second bimodal particles 76 can decrease the viscosity of the suspension during the filling step, and can result in a higher green density of the fill.

It is appreciated that the bimodal distribution can achieve higher packing densities than the monomodal distribution. Thus, the resulting electrically conductive fill can be higher density. The second bimodal particles 76 can be the same material as the first bimodal particles 74. For instance, both the first and second bimodal particles 74 and 76 can be gold and/or at least one alloy thereof and/or at least one oxide thereof. In another example, both the first and second bimodal particles 74 and 76 can be platinum and/or at least one alloy thereof and/or at least one oxide thereof. In still another example, both the first and second bimodal particles 74 and 76 can be any suitable alternative material of the particles 62 described herein. Alternatively, the second bimodal particles 76 can be a different material than the first bimodal particles 74. For instance, the first bimodal particles 73 can be gold and/or at least one alloy thereof and/or at least one oxide thereof, and the second bimodal particles 76 can be platinum and/or at least one alloy thereof and/or at least one oxide thereof. In another example, the first bimodal particles 73 can be platinum and/or at least one alloy thereof and/or at least one oxide thereof, and the second bimodal particles 76 can be gold and/or at least one alloy thereof and/or at least one oxide thereof. In still another example, the first and second bimodal particles 74 and 76 can be any suitable two different materials (and/or at least one alloy and/or at least one oxide thereof) of the particles 62 described herein.

It is further recognized that the first and second bimodal particles 74 and 76 can be temperature stable during a future RDL step. In particular, the bimodal particles 74 and 76 can have a melting point greater than the temperature at which the RDL layer is applied.

Referring now to FIG. 3C, the particles 62 can alternatively define a trimodal distribution 73. The trimodal distribution can have a fill density of the electrically conductive particles in the via 34 that is greater than that of the bimodal distribution, and thus also greater than the monomodal distribution. Thus, it is envisioned that in some examples the vias 34 produced from the trimodal distribution 73 can have a greater electrical conductivity than the vias 34 produced from each of the bimodal distribution and the monomodal distribution.

The particles 62 can include the plurality of first bimodal particles 74 described above that define first trimodal particles, the plurality of second bimodal particles 76 described above that define second trimodal particles, and a plurality of third trimodal particles 78. The first trimodal particles 74 can have a first trimodal average particle size as described above with respect to the particles 62 of the monomodal distribution. Thus, the first trimodal particles 74 can define the interstices 66 described above. The interstices 66 of the trimodal distribution 73 can be referred to as first trimodal interstices. The second trimodal particles 76 can have the second trimodal average particle size that is less than the first bimodal average particle size of the first trimodal particles 74 as described above with respect to the first and second bimodal particles. The first trimodal particles 73 and the second trimodal particles 76 can cooperate so as to define second trimodal interstices 75 therebetween.

The third trimodal particles 78 can be disposed in the second trimodal interstices 75. In some examples, it can be desirable to maximize the size of the third trimodal particles 78 so that they fit in respective ones of the second trimodal interstices 75 without expanding the interstices 75. It is appreciated, however, that the third bimodal particles 78 can expand the second trimodal interstices 75 while increasing the density of the first particles 62a with respect to the bimodal distribution. Regardless, the first and second and third bimodal particles 76 and 78 can be said to combine so as to define third trimodal interstices 69 that are smaller than the second trimodal interstices 75.

The third trimodal particles 78 can have a third trimodal average particle size that is less than the second trimodal average particle size. While not being limiting unless otherwise indicated, the second trimodal average particle size and the third trimodal average particle size can define a ratio within a range from approximately 4:1 to approximately 10:1. For instance, the ratio can be approximately 7:1.

In one example, the third trimodal particles 78 can be made of any suitable electrically conductive material. For instance, the third trimodal particles 78 can be the same material as either or both of the first and second trimodal particles 74 and 76. Alternatively, the third trimodal particles 78 can be a different material than each of the first and second trimodal particles 74 and 76.

Referring now to FIG. 3D, the particles 62 can include a plurality of flakes 42. As will be appreciated from the below, when the particles 62 are compressed, the flakes 42 can break apart so as to define a substantially nonporous dense layer of the material that provides a barrier with respect to ingress of either or both of liquid and gas into the via 34.

The flakes 42 can be irregularly shaped, and can be sized and shaped differently from each other. The flakes 42 can have an average specific surface area within a range from approximately 0.15 meters squared per gram to approximately 17 meters squared per gram. For instance, the average specific surface area can be in a range from approximately 0.15 meters squared per gram to approximately 7 meters squared per gram. In another example, the average specific surface area can be in a range from approximately 0.15 meters squared per gram to approximately 2 meters squared per gram. In one example, the average specific surface area can be in a range from approximately 0.15 meters squared per gram to approximately 0.45 meters squared per gram. In another example, the average specific surface area can be approximately 17 meters squared per gram. In another example, the average specific surface area can be approximately 16 meters squared per gram. In still another example, the average specific surface area can be approximately 7 meters squared per gram. In yet another example, the average specific surface area can be approximately 2 meters squared per gram. In still another example, the average specific surface area can be approximately 1.5 meter squared per gram. In still another example, the average specific surface area can be approximately 0.76 meter squared per gram. It is recognized, of course, that the flakes 42 can have any suitable specific surface area as desired.

Further, a majority of the flakes can have an average aspect ratio within a range from approximately 2:1 to approximately 10:1. In one example, the flakes can be ball milled. Alternatively, the flakes are attritor milled. Alternatively still, the flake particles can be planetary milled. Alternatively still, the flakes can be cryo-milled. In this regard, it should be appreciated that the flakes can be fabricated in any suitable manner as desired. The flakes 42 can be the same metal as the substantially spherically shaped particles. Alternatively, the flakes 42 can be or a different metal than the final fill.

When a compressive force is applied to the flakes 42, for instance during an isostatic pressing operation described herein, the flakes can fracture into flake particles and become packed in the interstices 66 and/or 75 so as to provide conduction in addition to the substantially spherical particles. Thus, the substantially spherical particles can define a first plurality of particles 62, and the flakes 42 can define a second plurality of particles. The first plurality of particles 62 can define the monomodal distribution, the bimodal distribution, or the trimodal distribution described above. Further, the first plurality of particles 62 can be substantially spherical as described above, or can define any suitable alternative size and shape as desired. The flakes 42 can have a density from approximately 80 percent to approximately 98 percent.

Filling Through-Holes

Referring to FIGS. 4-8 generally, a method is provided for metallizing the holes 26 of the substrate 20 with the electrically conductive fill 35, thereby creating metallized vias. The method can include a filling step that includes the step of introducing an electrically conductive paste 40 is introduced into the holes 26. In some examples, the introducing step includes the step of depositing a quantity of the paste 40 to at least one of the first and second surfaces 22 and 24 of the substrate 20. The metallization step can also include performing the introducing step under an isostatic pressure that is applied to the substrate 20 and the paste 40. In some examples, the isostatic pressure can be applied under a first elevated temperature that partially cures the paste 40, and in particular the carrier 58. The first elevated temperature may be greater than room temperature. The method can further include the step of performing a final curing step at a second elevated temperature sufficient to fully cure the paste 40, and in particular the carrier 58, thereby producing the electrically conductive fill 35. After one or both of the filling step and the final curing step, at least one or both of the first and second external surfaces 22 and 24 of the substrate 20 can be planarized to remove residual paste 40 disposed on at least one or both of the first and second surfaces 22 and 24.

Figure 4:
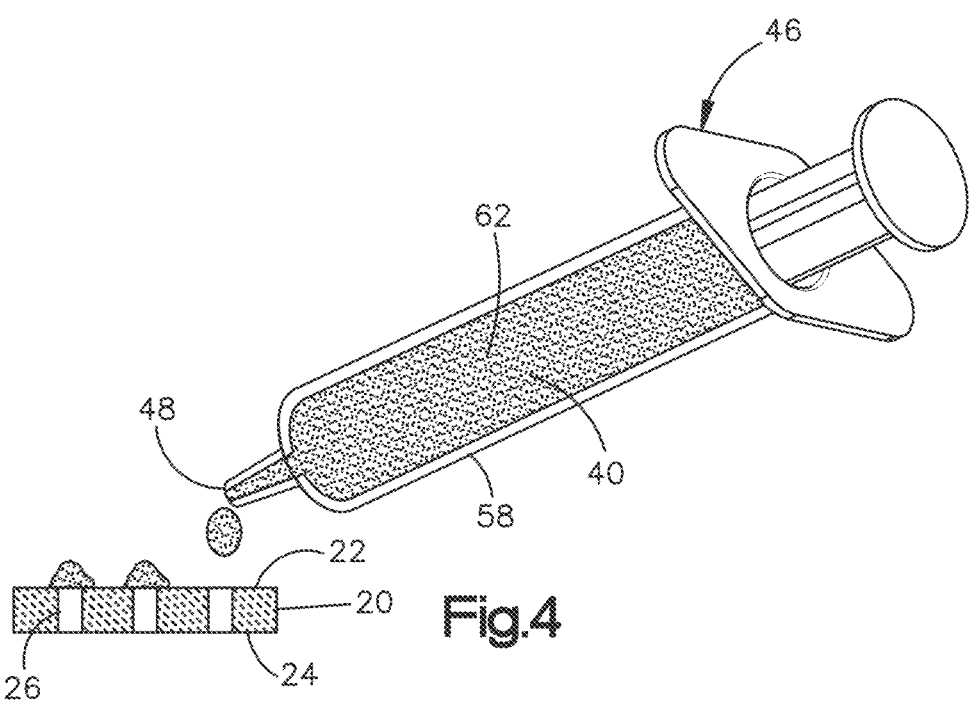
FIG. 4 is a perspective view of a delivery device shown delivering a quantity of paste to a substrate.

Referring now to FIG. 4, the introducing step can include the step of depositing a quantity of the paste 40 to the first surface 22 and not the second surface 24. The quantity of paste can be disposed at an alignment location 44 that is in alignment with a respective open end of a respective at least one of the holes 26. Otherwise stated, the paste 40 can extend along the respective external surface of the substrate 22 and across a respective at least one of the holes 26. In one example, the quantity of paste 40 can be deposited onto the substrate 20 from any suitable delivery device. For instance, a plurality of quantities of paste 40 can be deposited to respective alignment locations 44 that are aligned with an open end of only a single one of the holes 26. Alternatively, one or more quantities of paste 40 can be deposited to respective alignment locations 44 that are aligned with a plurality of open ends of a respective plurality of holes 26.

In one example, the delivery device can be configured as a syringe 46. Thus, an output end 48 of the syringe 46 can be aligned with the alignment location 44, and the quantity of paste 40 suitable to fill the at least one hole 26 is deposited from the output end 48 to the alignment location 44 of the substrate 20. The quantity of paste 40 thus covers the open end of the at least one of the holes 26. The syringe 46 can then be repositioned to deposit a subsequent quantity of paste 40 to a subsequent alignment location 44. This process can continue as desired until at least one quantity of paste 40 has been deposited at respective alignment locations 44 that are aligned with all holes 26 to be metallized. While the delivery device can be configured as the syringe 46 as described above, it is appreciated that any alternative delivery device suitable for depositing or otherwise delivering the paste 40 onto the substrate 20 is envisioned.

Figure 5A:
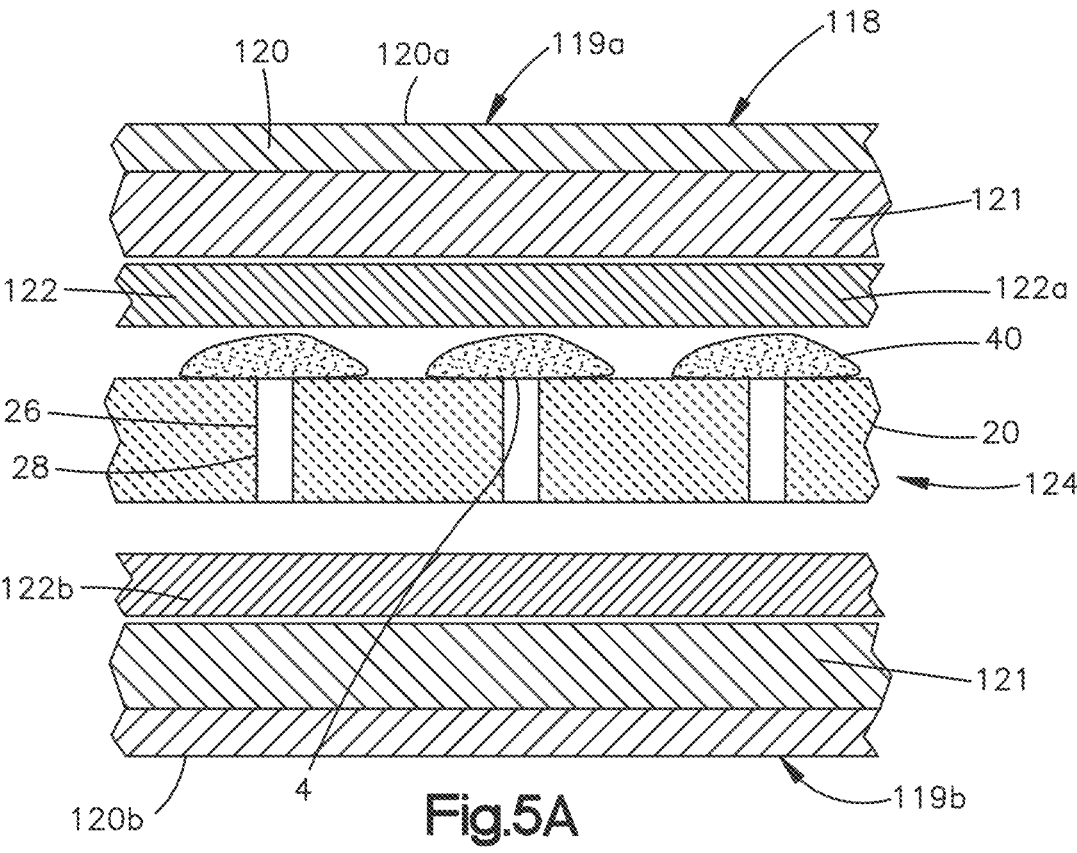
FIG. 5A is a schematic sectional view of the substrate shown disposed in an envelope that is configured to drive the particles into respective holes of the substrate illustrated in FIG. 4.
Figure 5B:
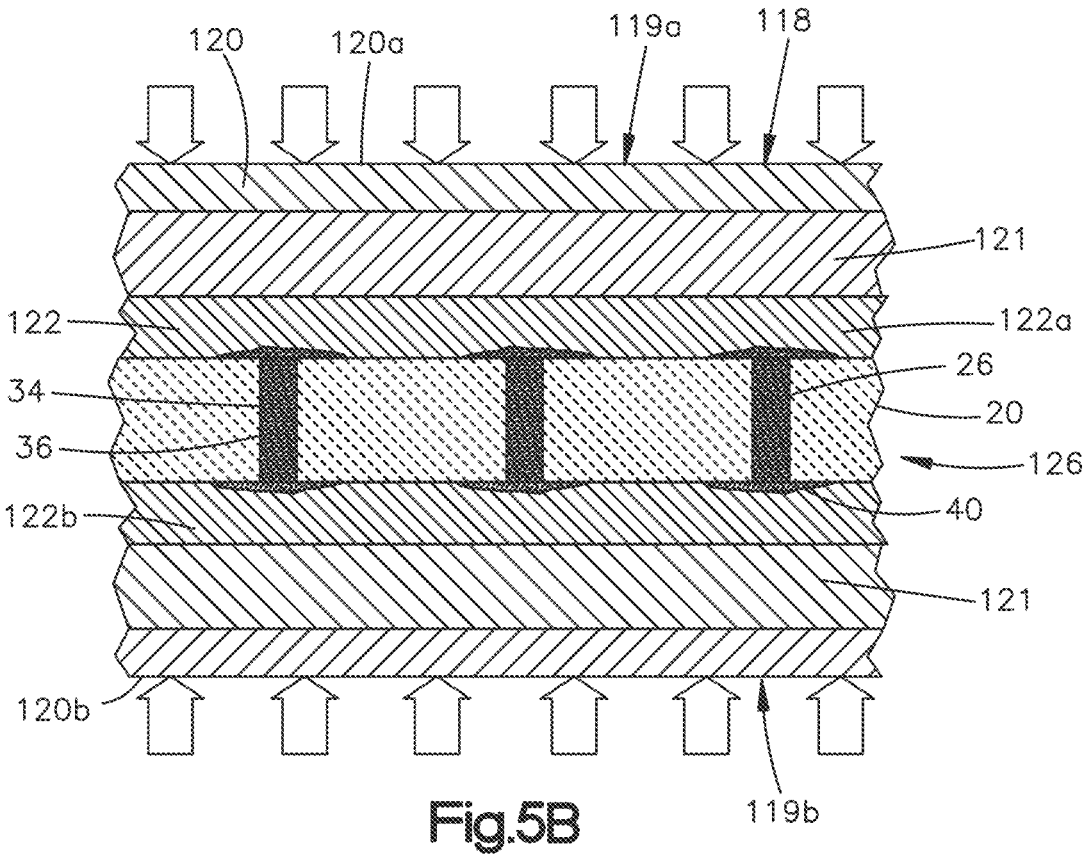
FIG. 5B is a schematic sectional view of the substrate disposed in the envelope as illustrated in FIG. 5A, but showing the envelope under pressure during application of isostatic pressure to drive the particles into the holes of the substrate.

Referring now to FIGS. 5A-5B, the paste 40 can be driven into the holes 26 under isostatic pressure. In accordance with the example illustrated at FIGS. 5A-5B, the substrate 20 can be placed in an envelope 118 after the paste 40 has been deposited to the substrate 20 in the manner described above. The envelope 118 includes a first laminate 119a and a second laminate 119b spaced from the first laminate 119a so as to define an internal space 124 that is size and configured to receive the substrate 20.

In particular, the first laminate 119a can include a first outer sheet 120a and a first inner layer 122a. The second laminate 119b can include a second outer sheet 120b and a second inner layer 122b. The first and second inner layers 122a and 122b face each other, and thus face the substrate 20 when the substrate 20 is disposed in the internal space. As will be appreciated from the description below, the first and second inner layers 122a and 122b can be referred to as first and second compression members, respectively, that are configured to apply a compressive force to the paste 40 that drives the paste 40 into the respective at least one hole 26. In particular, the first and second inner layers 122a and 122b can be sufficiently flexible so as to extend over the paste 40 and subsequently apply a force toward the respective surface of the substrate 20 so as to drive the paste 40 into the respective at least one hole. In this regard, the envelope 118 can be referred to as a soft pack envelope. Similarly, because the particles 62 become compacted against each other as the paste 40 is compressed and driven into the hole, the filling step can also be referred to as a packing step. Because the envelope 118 is a soft pack envelope, the packing step can be referred to as a soft packing step. It will be appreciated that the density of particles 62 in the paste 40 after the packing step can be greater than the density of particles 62 in the paste 40 prior to the packing step.

The internal space 124 is sized and configured to receive the substrate 20, such that the inner layers 122 face respective opposed surfaces of the substrate 20. Thus, at least one of the inner layers 122 faces the deposited paste 40. The outer sheets 120) are nonporous with respect to air and flexible, and can surround the inner layers 122. Accordingly, when the first and second laminates 119a and 119b are the fused to each other so that the internal space 124 is fully enclosed so as to define an enclosure 126, air is unable to enter the enclosure 126.

In one example, respective portions of the first and second laminates 119a and 119b can be sealed to each other so as to partially define the enclosure 126. The substrate 20 and paste 40 can then be placed in the internal space 124 prior to forming the enclosure 126 such that the first surface 22 faces one of the first and second inner layers 122a and 122b, and the second surface 24 faces the other of the first and second inner layers 122a and 122b. Next, a vacuum is applied to the internal space 124 of the enclosure 126 to remove the air from the internal space 124, and the first and second laminates 119a and 119b can be sealed, for instance heat-sealed, to each other so as to define the enclosure 126 under vacuum. When the envelope 118 is placed under vacuum, the inner layers 122a and 122b can lay flat against respective ones of the first and second external surfaces of the substrate 20 can extend over the holes 26. Further, the first inner layer 122a and the second inner layer 122b can lie against any overfilled particles 62 that extend out with respect to one or both of the surfaces 22 and 24.

Accordingly, referring now to FIG. 5B, the envelope 118 can be placed in a press that is configured to apply sufficient external pressure to the envelope 118, which in turn causes the paste 40 to flow into the respective aligned holes 26. For instance, the press can be an isostatic press that applies an isostatic pressure to the envelope 118. Thus, the filling step can include an isostatic packing step. The isostatic pressure can be applied to the outer sheets 120a and 122a as indicated by the arrows in FIG. 5B, which in turn applies the isostatic pressure to the inner layers 122a and 122b. The envelope, and in particular, the first and second inner layers 122a and 122b, can apply a corresponding force to the paste 40 that corresponds to the isostatic pressure to the first and second surfaces 22 and 24 of the substrate 20. The force is sufficient to drive the paste 40 from the respective external surface of the substrate 20 into the respective holes 26.

As described above, the external surface of the substrate 20 can define a first end of the hole 26. The force drives the paste 40 to flow from the first end of the hole 26 toward the second end of the hole 26. In one example, the force drives the paste 40 to flow from the first end of the hole to the second end of the hole 26. Thus, the paste 40 can fill the hole from the first and to the second end. In examples whereby the holes 26 are through-holes, the paste can fill the hole 26 from the first external surface 22 to the second external surface of the substrate 20. In examples whereby the holes 26 are blind holes, the paste can fill the hole from the external surface of the substrate 20, which defines the first end of the hole, to the second end of the hole 26.

The force can further cause the particles 62 to pack and densify in the carrier 58. Accordingly, the paste 40 has a greater packing density after the isostatic force has been applied than prior to application of the isostatic force. The paste 40 can thus be referred to as a packed paste after application of the isostatic force. Further, as described above, if the particles 62 include the flakes 42, the force applied by the inner layers 122a and 122b can cause the flakes to fracture, thereby further packing the resulting fill with additional electrically conductive material. The electrically conductive particles 62 can be present in sufficient quantity such that the paste 40 is electrically conductive prior to being deposited onto the substrate 20. Thus, the packed paste 40 in the hole 26 can similarly be electrically conductive. The resulting electrical via 34 is thereby electrically conductive from a first end of the paste 40 (or the resulting electrically conductive fill) to the second end of the paste 40 (or the resulting electrically conductive fill). In examples whereby the first and second ends of the paste 40 are disposed at the first and second ends of the holes or vias, the resulting via 34 is similarly electrically conductive from the first end of the via to the second end of the via.

The inner layers 122a and 122b can be made of any material suitable to deliver the corresponding force as described above. In one example, the inner layers 122a and 122b can be made of a viscoelastic material configured to pack the particles 62 of the paste 40. For instance, the inner layers 122*a* and 122*b* can distribute the isostatic pressure substantially uniformly across the respective external surface of the substrate 20. Thus, the inner layers 122*a* and 122*b* can mechanically pack the particles 62 into highly packed particles 62. It is therefore desirable that the inner layers 122*a* and 122*b* are made from a material that does not adhere to the particles 62, such that when the isostatic pressure is removed, the inner layers 122*a* and 122*b* can be removed from the substrate 20 without pulling the particles 62 out of the holes 26. In one example, the inner layers 122*a* and 122*b* can be made of Mylar. In another example, the inner layers 122*a* and 122*b* can be made of Teflon. The outer layers sheets 120*a* and 120*b* can be made of any suitable nonporous material. For instance, the outer sheets 120*a* and 120*b* can be made of a flexible metal such as aluminum.

In one example, the outer sheets 120*a* and 120*b* can include a fusion material 121 such as mylar coated to their respective inner surfaces if desired. The fusion material 121 can fuse to itself to create the vacuum enclosure 126. The inner layers 122*a* and 122*b* can be separate from the outer sheets 120*a* and 120*b*, and placed between the outer sheets and the substrate 20. Alternatively, the inner layers 122*a* and 122*b* can line the outer sheets 120*a* and 120*b* as desired.

The isostatic pressure can be in the range of approximately 500 pounds per square inch (PSI) to approximately 60,000 PSI. For instance, the isostatic pressure can be in the range of approximately 1,000 PSI to approximately 10,000 PSI. In one example, the isostatic press can be configured as a warm isostatic press (WIP) that can configured to apply the isostatic pressure at the first elevated temperature that can be up to and including the curing temperature of the carrier 58. The first elevated temperature can be achieved by placing the envelope in a liquid bath, such as water, that is at the first elevated temperature. In one example, the first temperature can be in a range from approximately 50 C to approximately 250 C for any suitable time duration sufficient to cause the carrier 58 to partially cure and adhere to the internal surfaces 29 of the substrate 20. In one example, the isostatic pressure is applied at a temperature of approximately 60 C. In one example, the isostatic pressure can be applied at a temperature that is insufficient to sinter the particles 62, as the paste 40 can be electrically conductive without sintering the particles 62. The time duration can be between approximately 15 min and approximately 3 hours, such as approximately 45 minutes. The time duration can vary as desired. Alternatively, the isostatic press can be configured as a cold isostatic press (CIP) that applies isostatic pressure at room temperature.

When the carrier 58 is sodium silicate, the filling step can be performed at the first temperature in a range from approximately 40 C to approximately 90 C, at an isostatic pressure between approximately 500 PSI to approximately 10,000 PSI for a time duration up to approximately an hour. For instance, in one example, the temperature can be approximately 60 C at an isostatic pressure of 6,000 PSI for a time duration of approximately 45 minutes. It is recognized that the temperatures, pressures, and time durations can vary as desired.

Though the first and second inner layers 122*a* and 122*b* can apply the force to the substrate 20 and particles 62 in one example, it should be appreciated that isostatic pressure can drive the paste 40 into the holes 26 in accordance with any suitable alternative embodiment as desired. It is envisioned in other examples a hard press can be used to drive the paste 40 into the holes, or any suitable alternative method that provides a force sufficient to drive the paste 40 into the holes

26. Alternatively still, the paste 40 can be driven into the holes 26 under positive vacuum pressure, negative vacuum pressure, centrifugal forces, or electrostatic forces as disclosed in PCT Publication No. WO 2020/160343 A1, published Aug. 6, 2020, and included herein as Exhibit A. PCT Publication No. WO 2020/160343 A1 therefore forms part of the present disclosure.

When the holes 26 are through-holes as illustrated in FIGS. 5A-5B, the paste 40 can be deposited onto the first external surface 22 of the substrate 20, and application of the isostatic pressure causes the corresponding force to drive the paste 40 from the first external surface 22 to the second external surface 24. A greater volume of paste 40 can be deposited onto the substrate 20 than the volume of the holes 26 to be occupied by the paste 40 in order to ensure that the holes 26 are fully filled with paste 40 during the filling step. As a result, application of isostatic pressure causes residual paste 40 to extend along either or both of the first and second external surfaces 22 and 24. Further, as the particles 62 become compacted during the application of isostatic pressure, which can displace some of the carrier 58 disposed in the hole 26 and causing additional carrier 58 to travel out of the hole 26 and onto either or both of the external surfaces 22 and 24 of the substrate 20.

Figure 6:
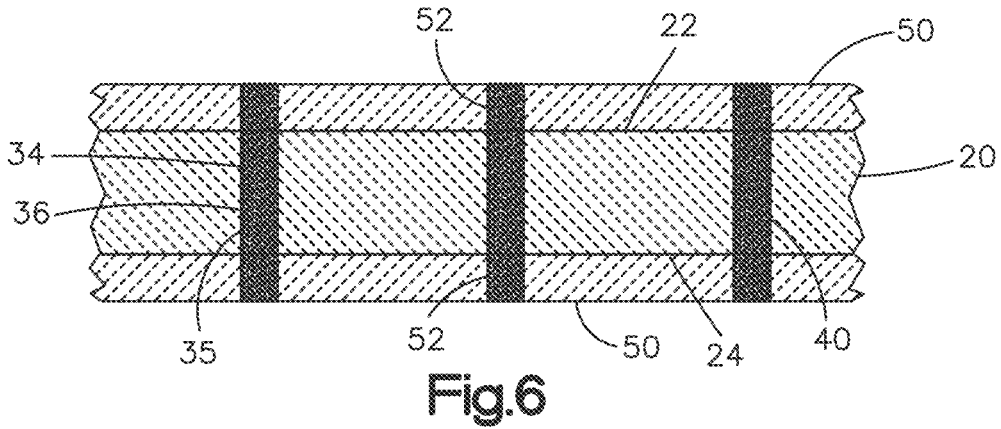
FIG. 6 is a schematic sectional side elevation view of the substrate including a sacrificial layer that extends along respective external surfaces of the substrate.

In another example, referring to FIG. 6, a respective sacrificial layer 50 can be applied to either or both of the first and second external surfaces 22 and 24 of the substrate 20. The sacrificial layer 50 can define at least one aperture 52 that is in alignment with a respective at least one of the holes 26. The sacrificial layer 50 thus defines a height that effectively increases the length of the respective holes 26 at either or both of the first and second surfaces 22 and 24. Thus, when the holes 26 of the substrate 26 are filled in the manner described above, residual paste 40 can extend outboard of each of the first and second surfaces 22 and 24 when the hole 26 is a through hole. When the hole 26 is a blind hole, then the paste can extend beyond only one of the first and second surfaces 22 and 24. The at least one aperture 52 defined by the sacrificial layer 50 can be at least partially or entirely filled with paste 40 after the filling step, thereby ensuring that the hole 26 has been substantially filled with the paste 40. Once the filling step has been completed, the sacrificial layer 50 and the residual paste can be removed using chemical mechanical polishing (CMP), mechanical polishing, and/or lapping process as described below.

Figure 7A:
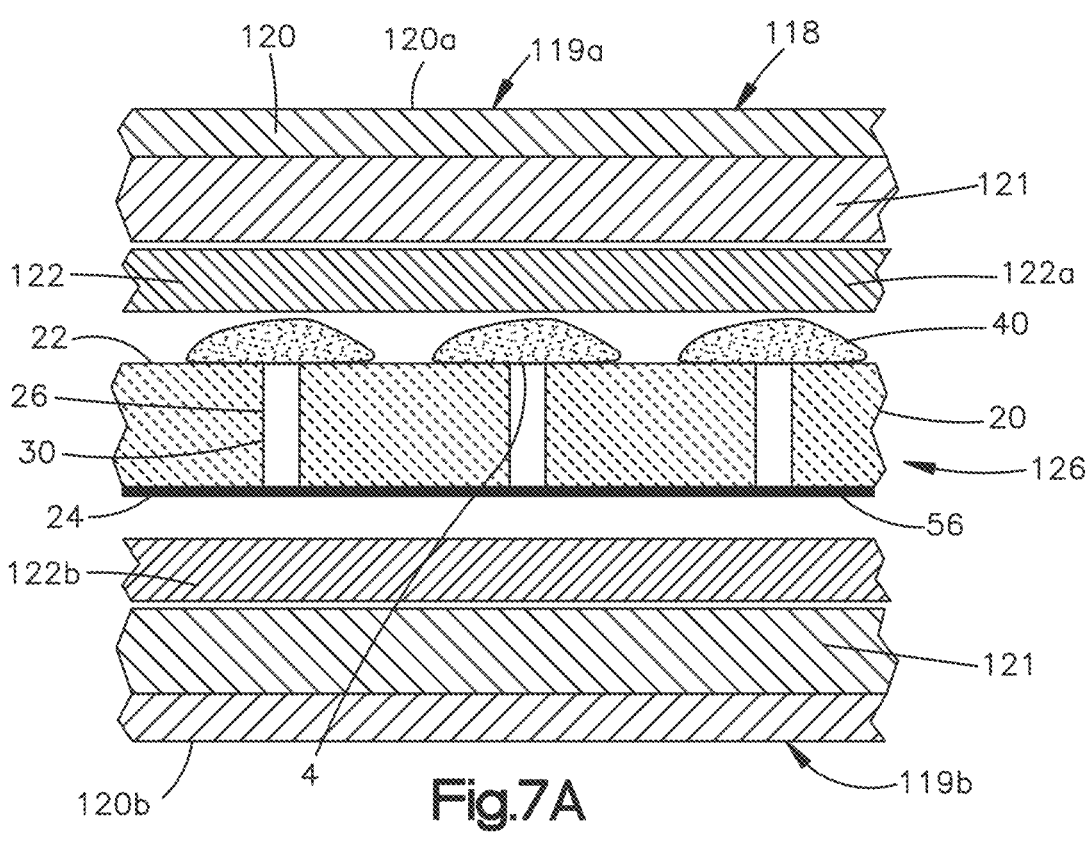
FIG. 7A is a schematic sectional view of the substrate shown disposed in an envelope that is configured to drive the particles into respective holes of the substrate illustrated in FIG. 4, wherein the substrate includes a closure layer so as to create a blind hole.
Figure 7B:
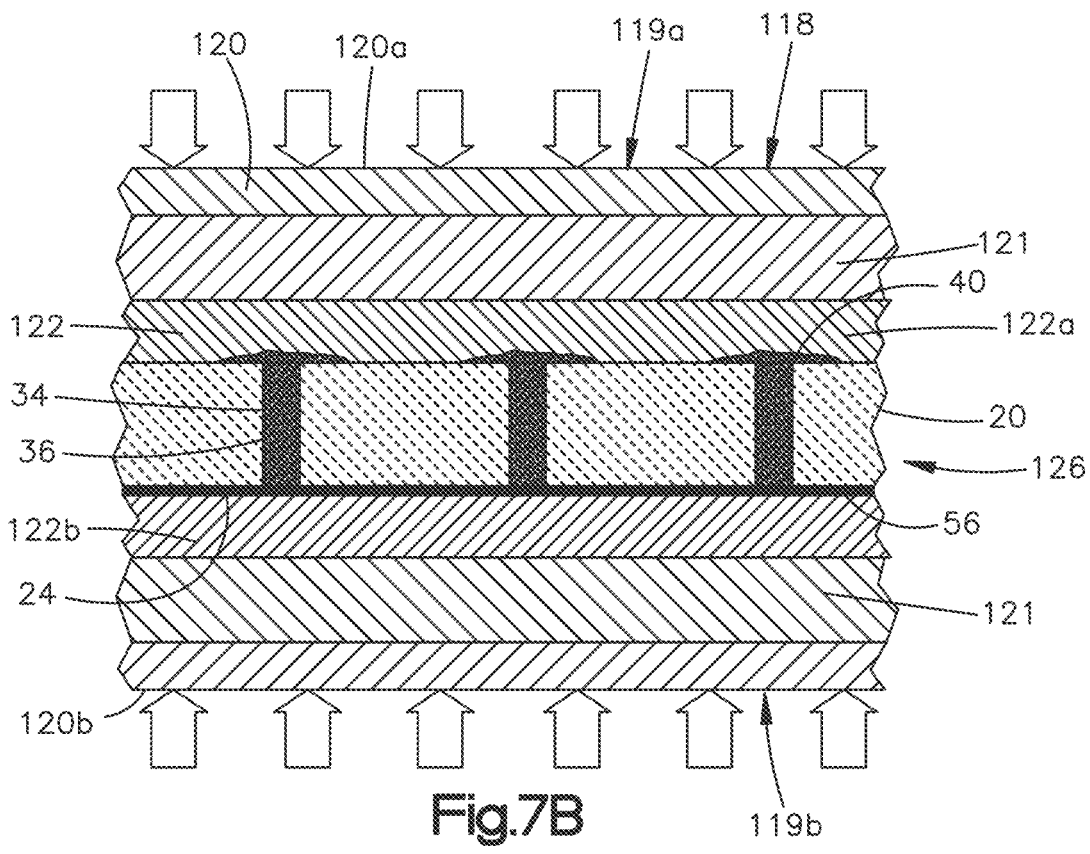
FIG. 7B is a schematic sectional view of the substrate disposed in the envelope as illustrated in FIG. 7A, but showing the envelope under pressure during application of isostatic pressure to drive the particles into the holes of the substrate.

Referring now to FIGS. 7A-7B, at least one of the holes 26 can be configured as blind holes 30. For instance, a closure layer 56 can extend across the second external surface 24 of the substrate 20 so as to define blind holes 30 having a first end that is open at the first surface, and a second end that is enclosed by the closure layer 56. The closure layer 56 can define the closed end of the blind holes 30. In one example, the closure layer 56 can be a titanium layer, though it should be appreciated that any suitable alternative material can be used. When the holes 26 are blind holes 30, the paste 40 can be deposited onto the first external surface 22 of the substrate 20, and the substrate 20 can be placed in the envelope 118, and isostatic pressure can be applied to the substrate 20 in the manner described above. The corresponding force applied to the paste 40 is sufficient to drive the paste 40 into the respective blind holes 30 in the manner described above. In particular, the paste 40 is driven from the first surface 22 to the closed end of the blind holes 30. Thus, paste 40 can extend from the closed end of the blind holes 30 toward the first surface 22. In one example, the paste 40) can extend from the closed end of the blind holes 30 to the first surface 22. Further, as described above, the particles 62 can become compacted against each other so as to define packed paste 40 in the manner described above. Further still, the compaction of the particles 62 can drive the carrier 58 out of the holes 26 and onto the first external surface 22 in the manner described above. In this regard, it should be appreciated that excess paste is prevented from flowing onto the second exterior surface 24 of the substrate 20. After the filling step or final curing step has been completed, the closure layer 56 can be removed. Alternatively, the closure layer 56 can be patterned to define a redistribution layer as desired.

Figure 8:
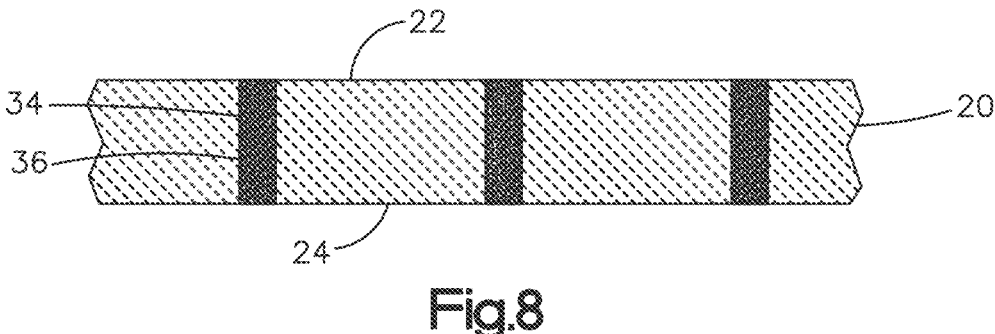
FIG. 8 is a schematic sectional view of the substrate shown after the filling step has been completed, and after a planarization step has been completed.

Referring now to FIG. 8, after the filling step has been completed, the method can include the step of planarizing at least one or both of the first external surface 22 and the second external surface 22 and 24, respectively, so as to remove the residual paste 40. When at least one of the holes 26 defines a through-hole as describe above with respect to FIGS. 5A-5B, residual paste 40) can be disposed on one or both of the first and second external surfaces 22 and 24, respectively. When at least one of the holes 26 defines a blind hole as described above with respect to FIGS. 6A-6B, residual paste 40 can be disposed on the first surface 22 but not the second surface 24.

In one example, the residual paste 40 can be removed using any suitable planar mechanical device such as a razor blade. In particular, the razor blade can be scraped along the at least one of the first and second external surfaces 22 and 24 so as to remove the residual paste 40. In another example, the residual suspension or residual polymer 137 can be removed by performing a chemical mechanical polishing (CMP) step to either or both of the first and second surfaces 22 and 24. Any suitable slurry can be chosen as an etching solution for the selective CMP removal of the paste 40. Alternatively, either or both of the first and second surfaces 22 and 24 can be polished using any suitable mechanical polishing technique with an abrasive pad and and/or an abrasive slurry. Alternatively still, either or both of the first and second surfaces 22 and 24 can be polished using any suitable lapping technique. It should be appreciated that any one or more of the above-identified planarizing steps or any suitable alternative polishing step can be used to planarize either or both of the first and second surfaces 22 and 24 after the filling step. Alternatively or additionally, any one or more of the above-identified planarizing steps or any suitable alternative polishing step can be used to planarize either or both of the first and second surfaces 22 and 24 after a final curing step as will now be described.

Figure 9:
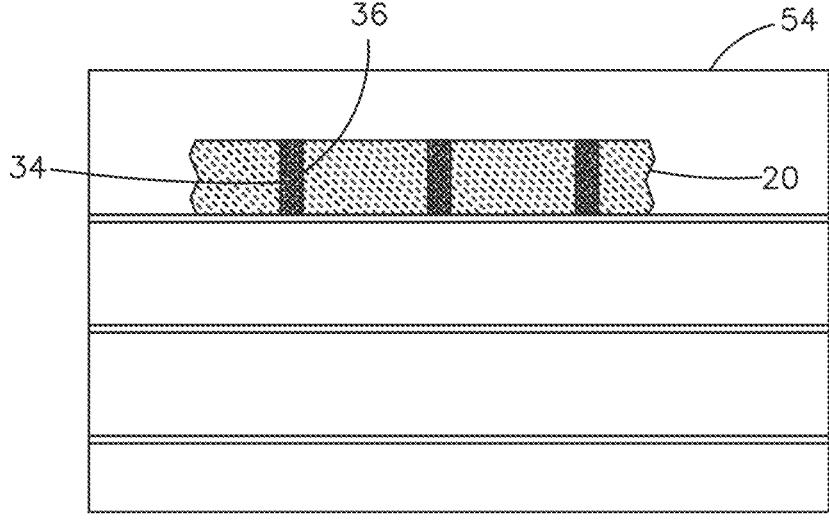
FIG. 9 is a schematic elevation view showing the substrate of FIG. 8 disposed in an oven during a final curing step.

Referring now to FIG. 9, the method of metallizing the holes 26 can include the step of finally curing the paste 40 that is disposed in the holes 26. The step of finally curing can include subjecting the substrate 20 to a second elevated temperature that is greater than the first elevated temperature used to partially cure the paste 40. When the carrier 58 is an epoxy, the second elevated temperature can be in a range from approximately 125 C to approximately 300 C. Otherwise stated, the second elevated temperature can be no greater than approximately 300 C. In one example, the substrate 20 is placed in any suitable oven 54 for a desired time duration at the second elevated temperature. In one example, the time duration can be between approximately 5 hours and approximately 40 hours, such as approximately 20 hours. It is appreciated, of course, that the epoxy can alternatively be cured in other ranges of the second elevated temperature for other time durations. The resulting via 34 can have a hermeticity of approximately $10^{-10}$.

Referring When the carrier 58 is sodium silicate, the final curing step can include increasing the second temperature from room temperature to a range from approximately 70 C to approximately 120 C, such as approximately 95 C. The second temperature can be increased at a rate of approximately 1 C to approximately 5 C, such as approximately 3 C per minute. The second temperature can then be maintained for a time duration from approximately 15 min to approximately 2 hours, such as approximately 45 min. After the time duration has expired, the second temperature can be increased to a range from approximately 125 C to approximately 225 C, such as approximately 175 C, for instance at a rate of approximately 1 C to approximately 5 C, such as approximately 3 C per minute. The second temperature can be maintained for a subsequent time duration that is in a range from approximately 30 minutes to approximately 2 hours, such as approximately 60) minutes. The second temperature can then be allowed to cool to room temperature.

It is recognized that the second elevated temperature can be less than the temperature at which the particles 62 sinter. Thus, the method of metalizing the holes 26 can be performed without sintering the particles 62. It can therefore be said that the electrically conductive particles 62 of the resulting electrically conductive fill 35 can be non-sintered. Alternatively, the second elevated temperature can reach the temperature at which the particles 62 sinter, for instance when the particles are gold. However, without being bound by theory, it is believed that the carrier 58 of the paste 40 can prevent the particles 62 from sintering. While some partial sintering may occur, it can be said that the resulting electrically conductive fill 35 is substantially non-sintered. In other examples, the particles 62 can be sintered if desired. In this regard, it is recognized that the paste 40 is electrically conductive prior to subjecting the paste 40 to either of the first and second elevated temperatures. Further, the paste 40 can be electrically conductive prior to filling the holes 26 with the paste 40. While the paste 40 is partially cured and finally cured at the first and second elevated temperatures, it is recognized in alternative examples that the paste 40 in the holes 26 can alternatively or additionally be cured by exposing the paste 40 to ultraviolet (UV) light. Alternatively still, the paste 40 disposed in the holes 26 can be cured by exposing the paste 40 to the ambient environment for a prolonged period of time. Methods of partially and finally curing the paste 40 can be dependent upon the carrier 58 of the paste 40.

As described above, it is appreciated that the cured paste 40, and thus the electrically conductive fill 35, can extend from the first end of the via to the second end of the via. Thus, it can be said that the electrically conductive fill 35, and thus the via can consist of or consist essentially of the cured paste. The cured paste can consist of or consist essentially of the carrier 58 and the electrically conductive particles. In some examples, the paste 40 can be devoid of a solvent. It is recognized, however, that the paste 40 can include a solvent as desired. In particular, the carrier 58 can include a solvent.

Figure 10:
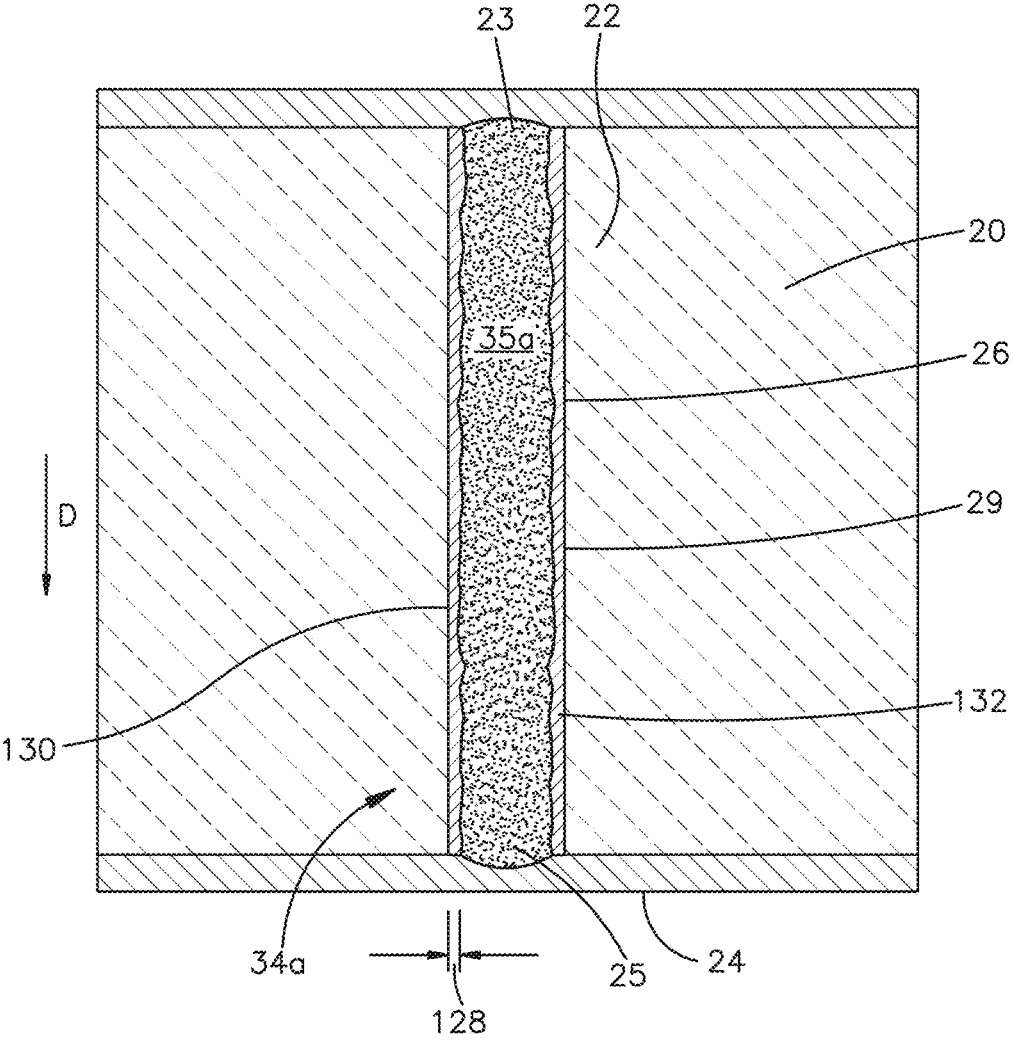
FIG. 10 is a side, cross-sectional view of a substrate with an electrically conductive via.

Shifting to FIG. 10, and as discussed above, an electrically conductive component can include a substrate 20 that can define an external first surface 22, an external second surface 24 opposite the first surface. A plurality of internal surfaces 29 that define a respective plurality of holes 26 open to at least one of or both of the first and second surface 22 and 24. At least one hole 26 or a plurality of holes 26 can each extend from the first surface 22 toward the second surface 24. The through hole 26 can define a first opening 23 at the first surface 22, and a second opening 25 at the second surface 24. Alternatively, the hole 26 can be a blind via, with only one of a first or second opening. 23, 25. The hole 26 can include a coating 128 positioned adjacent to its respective internal surface 29. The coating 128 can include a first layer 130 and a second layer 132, or just a second layer 132. The second layer 132 can be electrically conductive and define an electrically conductive via 34A. A fill, such as a high-temperature fill 35A, can be positioned in the hole 26. The fill 35A can be in physical contact with the second layer 132. The fill 35A can retain its material phase at a temperature of at least approximately 400 degrees Celsius, after the fill 35A is cured in the at least one hole 26. The fill 35A can be electrically non-conductive. The electrically conductive via 34A can be hermetically sealed.

Each hole 26 or holes 26 can define any suitable size and any cross-sectional shape, as desired. For instance, at least one or each hole 26 can be, in cross-section, hourglass shaped, cylindrically shaped, or V-shaped. The internal surface of the hourglass shaped hole 26 or high temperature electrically conductive via 34A can define a taper of at least one to three degrees.

The first layer 130 and the second layer 132 can each contain metals, metal oxides or metal alloys that are deposited in a respective hole 26 using different deposition techniques. The coating 128, first layer 130, and/or second layer 132, can each extend or each extend continuously along an entire length of the internal surface 29 of a respective hole 26. Further, the coating 128, first layer 130 and/or second layer 132 can extend along a portion of each of the first and second opposed surfaces 22, 24 of the substrate 20. The first layer 130 of the coating 128 can be optional and can be established on the internal surface 29 of the hole 26 via electroless plating or physical vapor deposition ("PVD"). The first layer 130 can be established by performing PVD on each of the first and second opposed surfaces 22, 24 of the substrate 20. The first layer 130 can be referred to as an adhesion layer. The first layer 130 can be made from a first metal such as titanium or an oxide thereof. The first layer 130 can be electrically conductive, or electrically non-conductive. The first layer can have a thickness within a range from approximately 0.01 nanometers to approximately 5 nanometers, such as 0.05 nanometers to approximately 1.5 nanometers.

A second layer 132 can be an electrical conductor layer of a second metal. For instance, the second metal can be copper, gold or silver. The second layer 132 can be applied using an electrochemical or sputtering deposition. The second layer 132 can be applied substantially uniformly along the optional first layer 130. The second layer 132 can have a thickness within a range from approximately 1 micron to approximately 15 microns, such as 3 microns to approximately 7 microns. The coating 128, first layer 130 and/or second layer 132 can be configured to not completely fill the narrowest portion or neck of the hole. For example, the coating 128 can be positioned to permit first and second ends of the corresponding hole 26 to be fluidly or continuously connected by a material or fill other than coating 128, first layer 130 or second layer 132. Stated another way, the coating 128, first layer 130 and/or second layer 132 can be positioned such that light or a fluid or a continuous fill can pass from the first end 23 of the hole 26 to the second end 25 of the hole 26, or from a respective first or second end 23, 25 of a hole 26 to a bottom of a blind via. Alternatively, the coating 128, first layer 130 and/or second layer 132 can obscure or close off one or more of the first end 23 and second end 25 of the hole 26. In such instances a portion of the coating 128, first layer 130, and/or second layer 132 can be removed using CMP, mechanical polishing, and/or lapping process.

High temperature fill 35A, which can be at least one of electrically non-conductive, electrically insulative or electrically conductive, can be introduced into the hole 26 in accordance with any suitable method described above. The fill 35A can be inserted or deposited in the hole 26 at room temperature/ambient temperature of approximately 15 to 25 degrees Celsius and can be cured at temperature between room/ambient temperature and about 300 degrees Celsius. For instance, the fill 35A can be introduced into a corresponding hole 26 or electrically conductive via 34A by squeegee, fluid pressure, centrifugal forces, electrostatically, isostatically or some combination thereof.

The fill 35A can occupy a substantial entirety of a remainder of the hole 26 that is not occupied by the coating 128. Thus, the coating 128 and the fill 35A can combine to entirely fill the neck of the hole 26. After the fill 35A is introduced into a respective hole 26 or electrically conductive via 34A and cured, the fill 35A can stay in a solid or mostly-solid state through temperatures of approximately 15 to 25 degrees C. through and including approximately 1000 degrees Celsius or through and including approximately 2800 degrees Celsius, resulting in a high temperature electrically conductive via 34A.

Fill 35A can, be a cement or epoxy, such as any one or any combination of Resbond 940-1, Resbond 940HT, Resbond 940LE, Resbond 901, Resbond 919, Resbond 940, Resbond 950, Resbond 989, Resbond 7030, Resbond 907GF brand cements and sealants, all commercially available from COTRONICS, Brooklyn NY: Pyro-Paint 634-ALP, Pyro-Paint 634-AS, Pyro-Paint 634-AS, Pyro-Paint 634-AS-1, Pyro-Paint 634-YO, Graphi-Coat 623 brand cements or sealants, all commercially available from AREMCO, Valley College, NY; and OMEGABOND 400 Series, 500 Series, 600 Series brand cements or sealants, all commercially available from OMEGA, Norwalk, CT. The fill 35A can be an organic free, cement-based fill. Organics can break down and outgas below 300 degrees Celsius. Using a cement based fill 35A allows thermal stability up to meting point of a conductor. The fill 35A can have a near perfect CTE match to the substrate 20, such as filling silica wafers with silica, filling sapphire wafers with $Al_2O_3$, etc., The fill 35A can be silica or may consist essentially of silica.

The resulting electrically conductive component can be used in environments that experience high temperatures, or environments that experience high temperatures where hermeticity is also a requirement. Examples include power applications where smaller vias can increase the 12R relationship, creating hotter electrically conductive vias and high energy downstream processing (CVD, thermocompression bonding, etc.).

Figure 11:
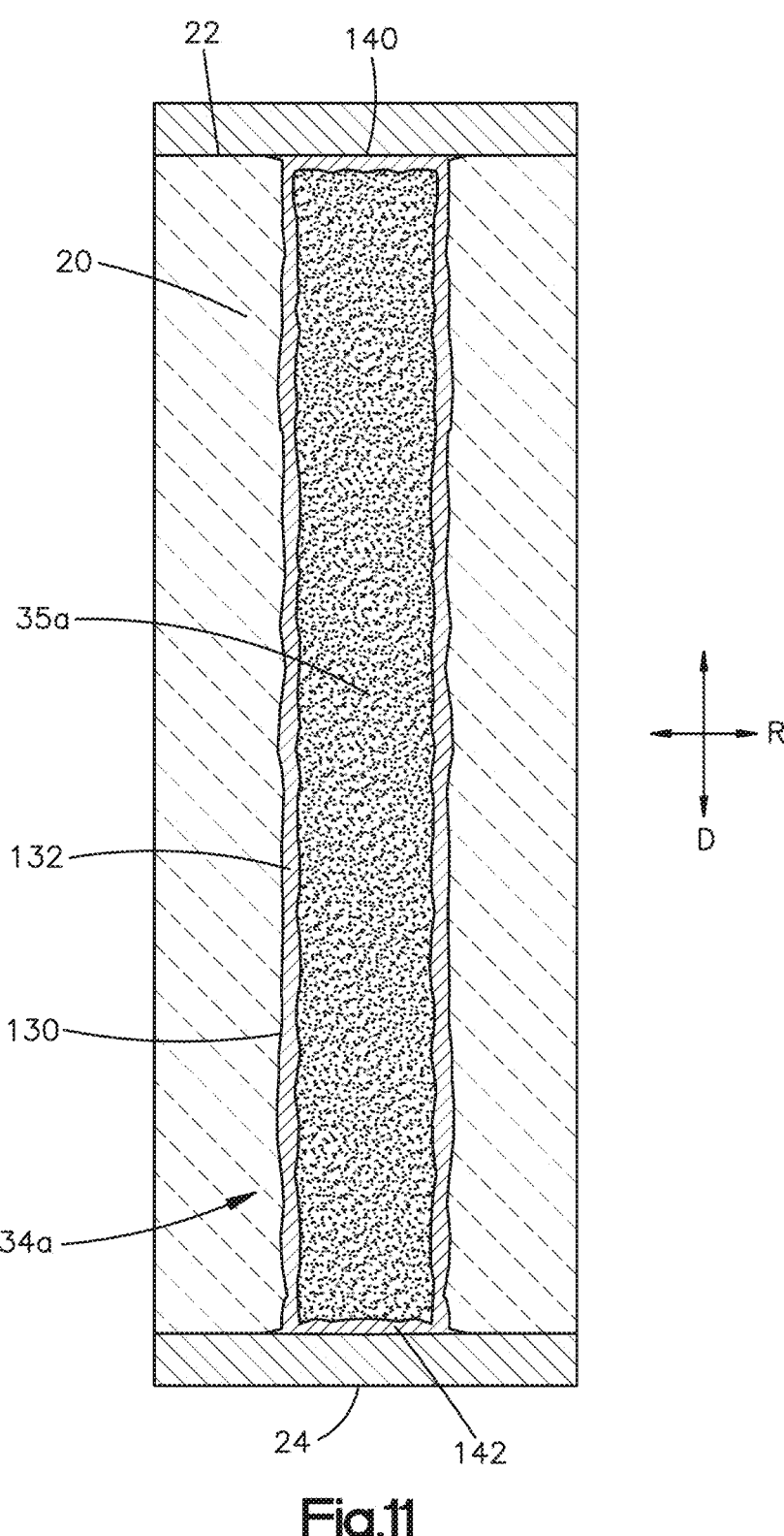
FIG. 11 is a side, cross-sectional view of a substrate with an electrically conductive via.
Figure 12:
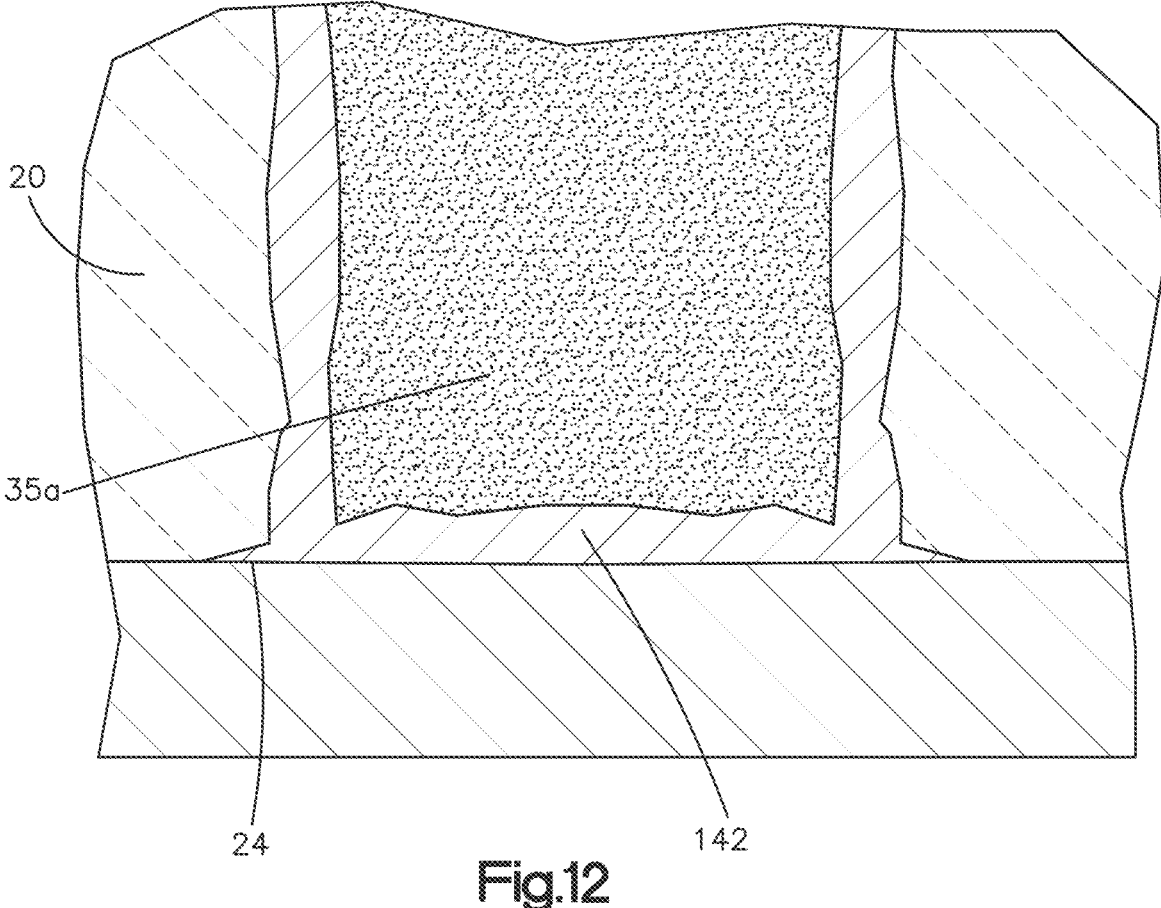
FIG. 12 is an enlarged side, cross-sectional view of the substrate with the electrically conductive via of FIG. 11.

The electrically conductive component can include a cap that defines a hermetically sealed via 34A even in high temperature environments, which in some examples can be at least 300 degrees Celsius. The electrically conductive component can also, or alternatively, include a porous cap that allows pressurized gas disposed in the hole to exit the hole through the cap. Referring now to FIGS. 11-12, a first cap 140 and/or a second cap 142 can be fabricated or otherwise established at first and second ends of the fill 35A that are opposite each other along the central axis of the hole. An electrically conductive material can be disposed in the hole 26 and define a first end and a second end opposite the first end along a central axis. The electrically conductive material can establish an electrically conductive path from the first end to the second end. The first cap 140 and second cap 142 can each be connected to the electrically conductive material to establish the electrically conductive via 34A. The first cap 140 can hermetically seal the via 34A. The first cap 140 can include a substantially solid layer that reduces or prevents the flow of gas or liquids. In general, a via can define a first open end and a second open end that can be fluidly connected together. The first open end can be sealed or partially sealed using a first substance or a first method and the second open end can be sealed or partially sealed using a second substance or a second method. The second substance can be different than the first substance. The second method can be different than the first method. Sealed can mean hermetically sealed to approximately $10^{-8}$ cubic atmospheres of helium per second. The via 34 from the first surface 22 to the second surface 24. The via 34 can be asymmetric about a plane that is perpendicular to the central of the hole 26.

The first cap 140 can be positioned at least partially or fully within the hole 26, which can be a plated or otherwise metallized through hole that extends unobstructed from the first surface 22 to the second surface 24. A portion of the fill 35A adjacent the first or second surfaces 22, 24 can be ground down or removed using CMP, mechanical polishing, and/or lapping process to create a recess such that the first and second caps 140, 142 can be positioned at least partially or fully within the hole 26. The first cap can have a thickness of about 0.5 microns to about 6 microns, about 2 microns to about 4 microns, or less than about 6 microns. Although the first cap 140 can be electroplated and the second cap 142 can be established by PVD, CVD, and ALD (atomic layer deposition), both the first cap 140 and second cap 142 can both be electroplated or otherwise fully sealed.

The first cap 140 can be established by electroplating. For example, the first surface 22 of the substrate 20 can be submerged in an electrolyte. The substrate 20 can then be removed from the electrolyte and at least one of spun, rinsed, and dried (SRD). The first cap 140 can then be applied at about room temperature or about 22 degrees C.

The electrically conductive material can define the second layer 132 having an outer surface that faces the first layer 130. The second layer 132 can have an inner surface opposite the outer surface that faces the fill 35A. The fill 35A can be disposed in an internal void that is defined by the second layer 132. In some embodiments, the first cap 140 can be established after introducing the electrically conductive material and the fill 35A into the hole 26 and allowing the fill 35A to cure. In other embodiments, the first cap 140 and electrically conductive material can be established during the same step prior to introducing the fill 35A into the hole 26.

An outer edge of the first cap 140 can extend radially beyond an outer edge of the hole 26. Alternatively, an outer edge of the first cap 140 can be configured not to extend radially beyond an outer edge of the hole 26. The first cap 140 can have an external surface substantially coplanar with the first surface 22 of the substrate 20. The first cap 140 can hermetically seal the electrically conductive via 34A even at elevated temperatures.

Residual liquid from the electroplating process utilized to create the first cap 140 may be in the hole 26 after the first cap 140 is manufactured. In some instances, exposing the substrate to elevated temperatures of at least 300 degrees C. may cause transform the residual liquid in the hole into pressurized gas. The pressurized gas can cause a cap to crack or rupture as the pressurized gas exits the hole 26. The second cap 142 can allow the pressurized gas to exit the hole through the second cap 142 while maintaining the size and shape of the second cap 142. For example, the second cap 142 can be porous to allow outgassing from the hole 26. In other words, the second cap 142 can allow outgassing from the hole 26 without cracking the second cap 142.

The second cap 142 can be established by PVD to create a physical deposition layer in the hole 26. PVD can provide a three-dimensional lattice structure including pores that allow gas or liquid to move through the second cap 142. For example, approximately $10^{-8}$ cubic atmospheres of helium per second can be considered to be a hermetically sealed via end. The second cap 142 can be configured such that it is not hermetically sealed. The second cap 142 can have a thickness along a direction D of about 1 micron to about 5 microns, about 5 microns to about 10 microns, less than about 10 microns, greater than about 1 micron, about 1 micron to about 2 microns, about 2 microns to about 3 microns, about 3 microns to about 4 microns, or about 4 microns to about 5 microns. The second cap 142 can have an outer surface substantially planar with the second surface.

One or both of the first and second cap 140, 142 can be in physical contact with the second layer 132. The first and second cap 140, 142 can be manufactured from the same material as the second layer 132. Alternatively, first and second cap 140, 142 can be manufactured from materials that are different from each other or different from the second layer 132. The first and second cap 140, 142 can include metals such as copper, gold or silver, metal oxides or metal alloys. The first and second cap 140, 142 can be manufactured from an electrically conductive material. The first and second cap 140, 142 can be electrically coupled to the second layer 132 to provide the electrically conductive via 34A. In some embodiments, the second cap 142 can be established at both ends of the via and the first cap 140 can be omitted.

A redistribution layer (RDL) can be applied to the second cap 142 and/or second surface 24 after the second cap 142 is established. The RDL can provide a hermetic seal to the second cap 142.

Figure 13:
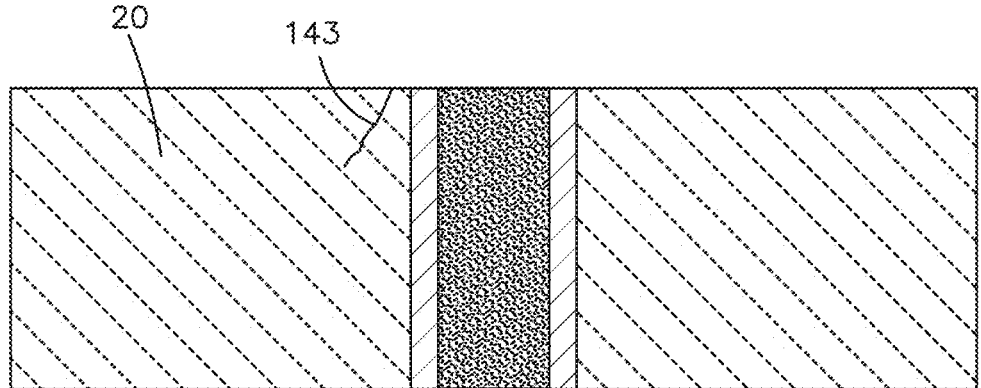
FIG. 13 is a side, cross-sectional view of a substrate with an electrically conductive via with fractures in the substrate.

A porous cap as described above may alleviate undesired cracking of the cap during any outgassing. However, as shown at FIG. 13, cracks 143 in the substrate are sometimes observed in the vicinity of the vias when the substrate and via cool from higher to lower temperatures. Without wishing to be bound by any particular theory, it is believed that the fill can contract as it cools. This contraction can exert a tensile force on the substrate sidewall that defines the hole of the via. The substrate around the via can crack when a sufficient tensile force is applied to the sidewall.

Referring now to FIGS. 14 to 19C, one or more recesses 144 can extend from the first surface 22 toward the second surface 24 and/or from the second surface 24 toward the first surface 22. The substrate sidewall can separate the recess 144 from the hole 26. The recess 144 can be radially spaced in its entirety from the hole 26. The recesses 144 can allow the substrate sidewall to flex as the fill cools and a tensile force is applied to the sidewall. The recess 144 can be formed by applying an etching solution to the substrate. The etching solution can be hydrogen fluoride or hydrofluoric acid or sodium hydroxide. The etching process may remove 0.5 microns of the substrate per minute. Etching can be performed at about 80 degrees C., about 100 degrees C., or about 120 degrees C. Alternatively, the recess 144 may be formed by grinding or cutting the substrate.

A laser may be applied in select locations to weaken the substrate before the etching process is performed. U.S. Pat. No. 9,656,909 is incorporated by reference as if set forth in its entirety herein. Applying the laser can help to control the size and shape of the recess and/or the time required to etch the recess 144.

Figure 15:
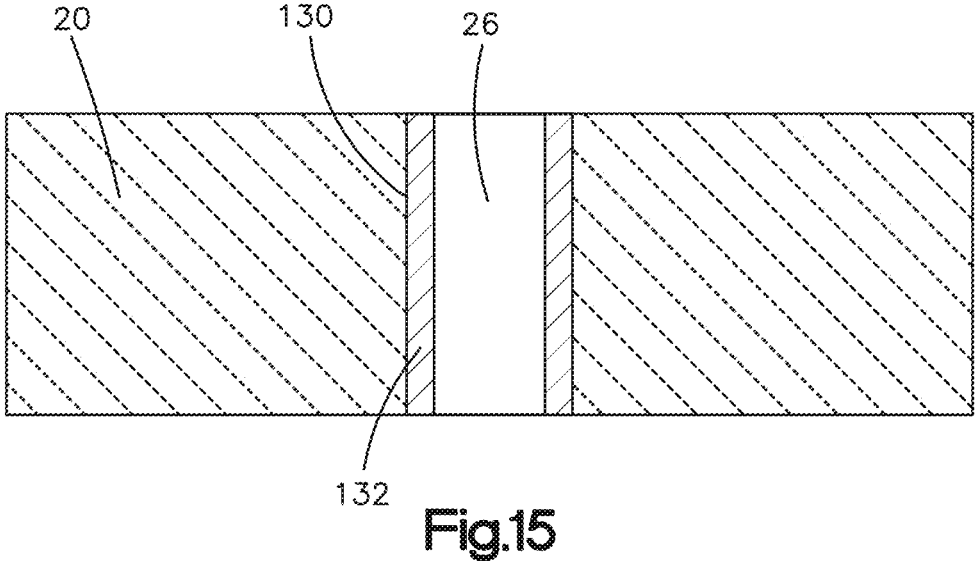
FIG. 15 is a side, cross-sectional view of a substrate with a hole and a first layer and second layer adjacent a sidewall of the substrate.
Figure 16:
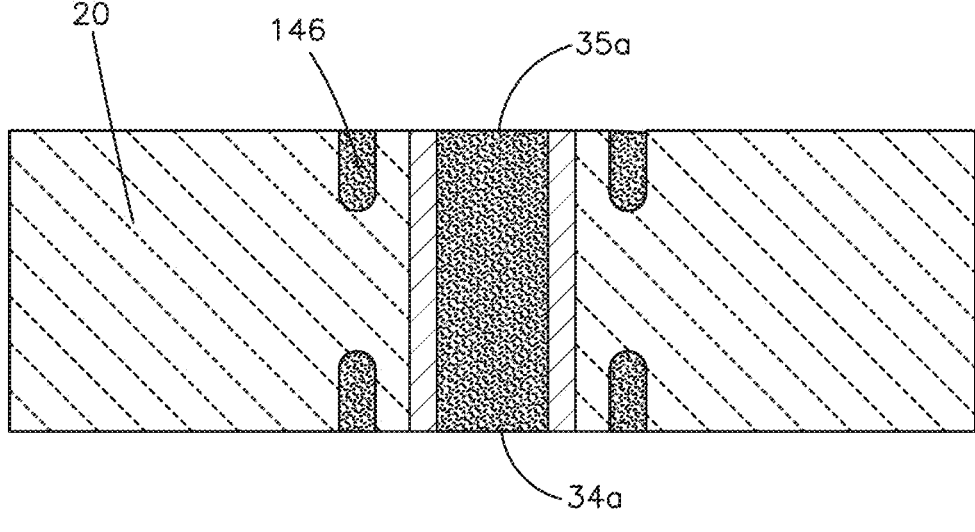
FIG. 16 is a side, cross-sectional view of the substrate of FIG. 15 with recesses in the substrate and a recess material in the recesses.

The recess 144 may be partially or fully filled with recess material 146 to solidify the substrate 20. The recess material 146 can be a dielectric paste, a metal, titanium, titanium tungsten, or copper. The recess material 146 can be the fill 35A (FIG. 16). Referring to FIGS. 15 and 16, the hole 26 can be formed in the substrate 20 and the first layer 130 and second layer 132 can be applied as previously described. The recess 144 can then be formed in the substrate 20. The fill 35A can then be introduced into the hole 26 and the recesses 144. For example, the fill 35A can be introduced via isostatic press as previously described.

Figure 17:
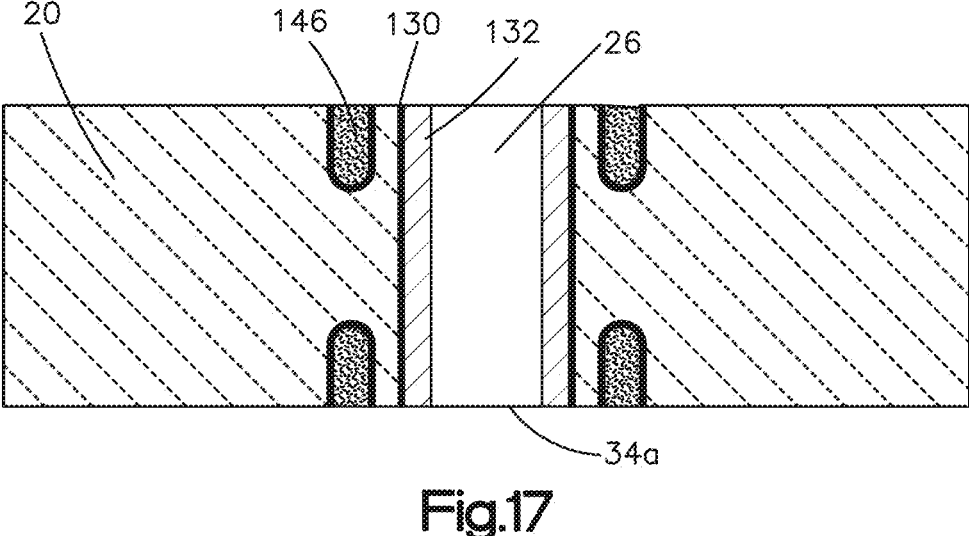
FIG. 17 is a side, cross-sectional view of a substrate with an electrically conductive via with recesses in the substrate and a recess material in the recesses.
Figure 18:
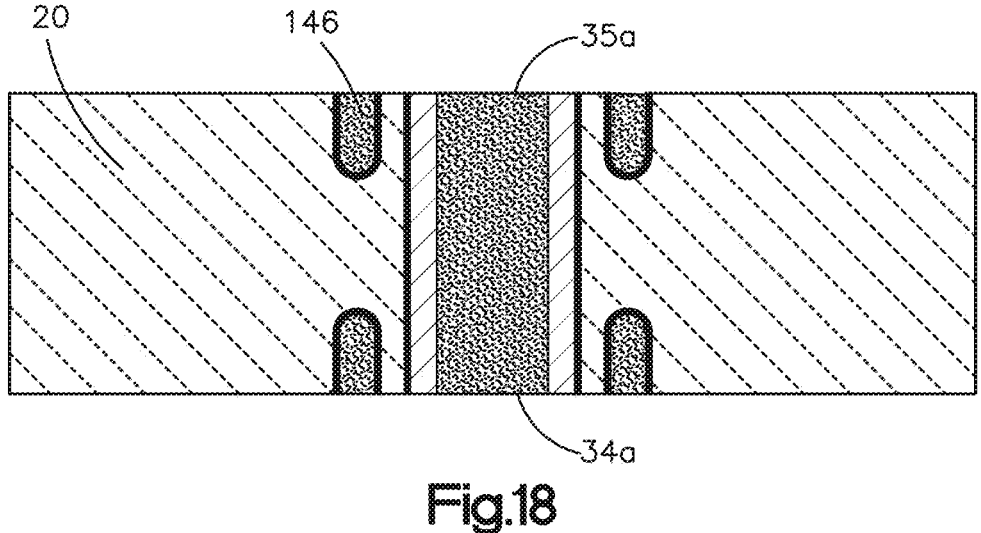
FIG. 18 is a side, cross-sectional view of the substrate of FIG. 17 with a fill in the hole.

Referring to FIGS. 17-18, the recess material 146 can be same as the first layer 130 and the second layer 132. The recess 144 may be formed in the substrate 120 after the hole 26 has been formed but prior to any material being introduced into the hole 26. The first layer 130 and the second layer 132 can then be introduced into each of the hole 26 and the recess 144. The fill 35A can then be introduced into the hole 26 as previously described.

Figure 14:
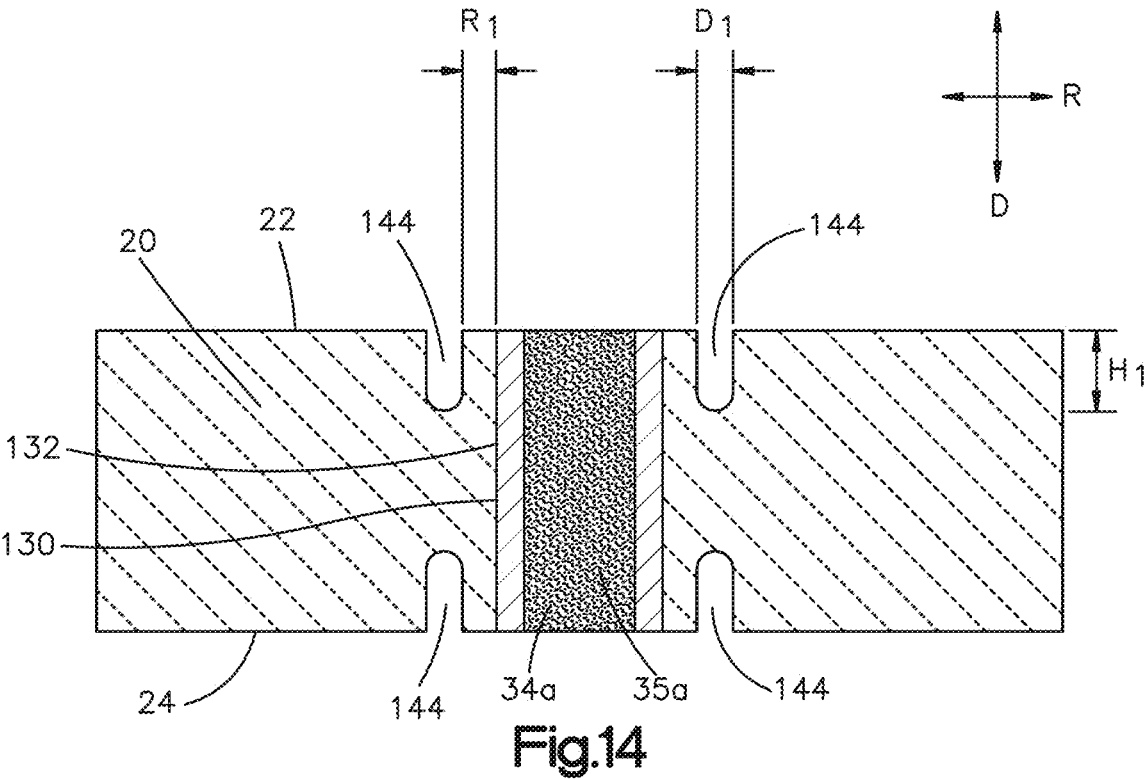
FIG. 14 is a side, cross-sectional view of a substrate with an electrically conductive via and recesses in the substrate.

Referring to FIG. 14, an inner edge of the recess 144 can be spaced along a direction R from an outer edge of the via 34 by a distance $R_1$. Distance $R_1$ can be about 10 microns to about 50 microns. Alternatively, the recess 144 may extend radially outwardly from the hole 26. Each recess 144 can define any suitable size and any cross-sectional shape, as desired. For instance, at least one or recess 144 can be, in cross-section, hourglass shaped, cylindrically shaped, or V-shaped. The recess 144 can define a taper of at least one to three degrees. For example, the recess 144 can have a generally cylindrical cross-sectional shape with a diameter $D_1$ of about 5 microns to about 20 microns. The recess can have a height $H_1$ of about 0.1 microns up to about a quarter of the height of the substrate 20. The height $H_1$ may be less than half a height of the hole 26.

Figure 19A:
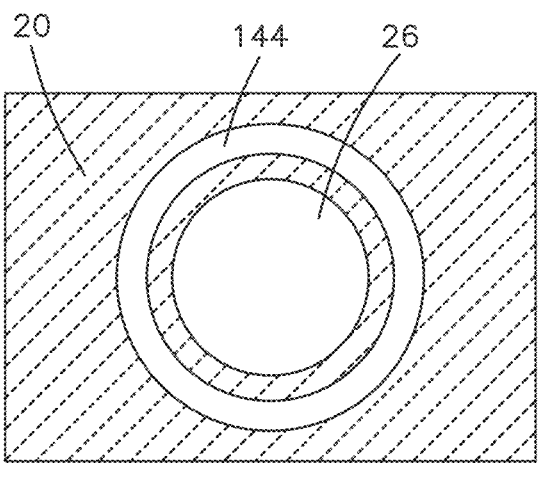
FIG. 19A is a top plan view of a substrate with a hole and reliefs in the substrate in accordance with one example.
Figure 19B:
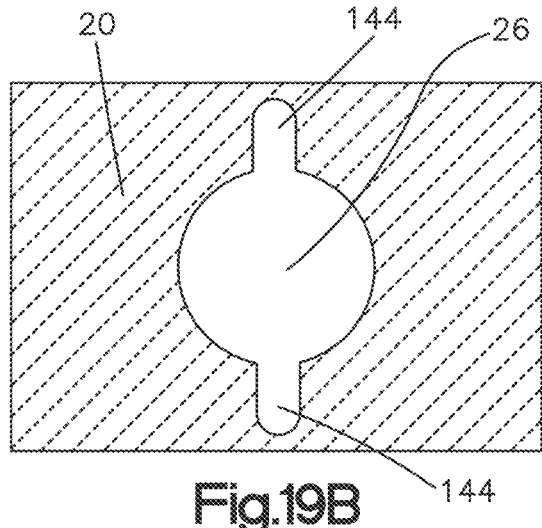
FIG. 19B is a top plan view of a substrate with a hole and reliefs in the substrate in accordance with another example.
Figure 19C:
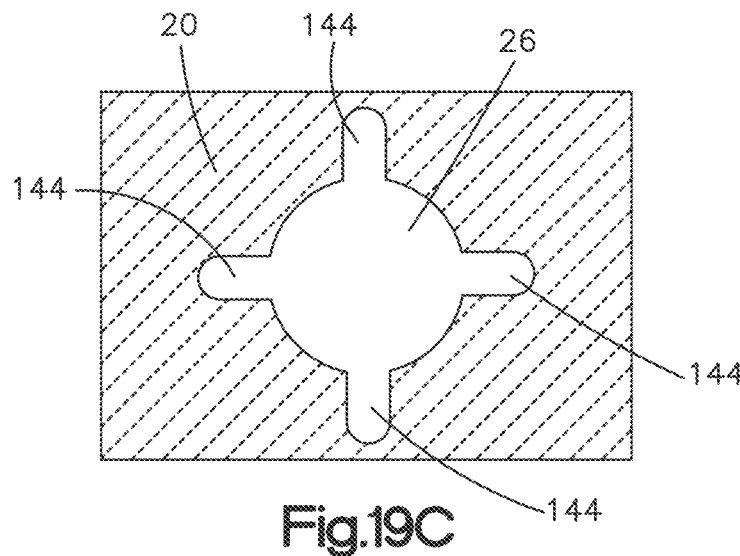
FIG. 19C is a top plan view of a substrate with a hole and reliefs in the substrate in accordance with yet another example.

Referring to FIGS. 19A to 19C, some example patterns of recesses 144 are shown. The recess 144 may surround the hole 26 (FIG. 19A). A plurality of recesses may extend outwardly from the hole 26 (FIGS. 19B and 19C). Alternatively, the recess 144 can define any suitable size and shape, as desired.

Various modifications of the disclosure, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present disclosure, it will be readily apparent to those skilled in the art that modifications may be made thereto which do not exceed the scope of the appended claims. Therefore, the scope of the disclosure is only to be limited by the following claims. Reference numbers recited in the claims are exemplary and for ease of review by the patent office only, and are not limiting in any way. In some embodiments, the figures presented in this patent application are drawn to scale, including the angles, ratios of dimensions, etc. In some embodiments, the figures are representative only and the claims are not limited by the examples shown in the figures. In some embodiments, descriptions of the disclosures described herein using the phrase "comprising" includes embodiments that could be described as "consisting of" or "consisting essentially of," and as such the written description requirement for claiming one or more embodiments of the present disclosure using the phrase "consisting of" or "consisting essentially of" is met.

What is claimed:

1. An electrically conductive component comprising:
a substrate defining:
an external first surface;
an external second surface opposite the first surface;
at least one electrically conductive via that extends from the first surface to the second surface;
an electrically non-conductive fill positioned in the at least one electrically conductive via, wherein a portion of the electrically non-conductive fill is removed to create recesses; and
a first end cap and a second end cap established at first and second ends of the fill in the recesses, respectively, such that the first and second end caps are positioned fully within the via;
wherein the first end cap defines a radially outermost edge that does not extend radially beyond an outer edge of the via, each of the first and second end caps comprises electroplated copper, the first end cap has a thickness of 0.5 micron to 6 microns, and the second end cap has a thickness from 1 micron to 5 microns.

2. The electrically conductive component of claim 1 wherein the first end cap is a solid layer.

3. The electrically conductive component of claim 1 wherein the at least one electrically conductive via is hermetically sealed by the first end cap.

4. The electrically conductive component of claim 1, wherein the first end cap has a thickness of about 2 microns to about 4 microns.

5. The electrically conductive component of claim 1 wherein the second end cap is not hermetically sealed.

6. The electrically conductive component of claim 1, wherein the fill retains its material phase at a temperature of 400 degrees Celsius after the fill is cured in a hole that defines the via.

7. The electrically conductive component of claim 1, wherein the substrate comprises an internal surface that defines a hole that, in turns, defines the via, wherein the via comprises a coating disposed adjacent the internal surface.

8. The electrically conductive component of claim 7, wherein the fill is in physical contact with the coating.

9. The electrically conductive component of claim 8, wherein the coating extends along the external first and second surfaces.

10. The electrically conductive component of claim 7, wherein the coating comprises a first layer and a second layer, wherein the second layer is electrically conductive.

11. The electrically conductive component of claim 10, wherein the fill is positioned is in physical contact with the second layer.

12. The electrically conductive component of claim 10, wherein the first layer is applied to the internal surface by electroless plating or physical vapor deposition.

13. The electrically conductive component of claim 1, wherein each of the first and second end caps directly abut the electrically non-conductive fill.

* * * * *